(12) United States Patent
Ieda

(10) Patent No.: US 8,441,009 B2
(45) Date of Patent: May 14, 2013

(54) SEMICONDUCTOR DEVICE AND MANUFACTURING METHOD THEREOF

(75) Inventor: Yoshinori Ieda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 329 days.

(21) Appl. No.: 12/974,254

(22) Filed: Dec. 21, 2010

(65) Prior Publication Data

US 2011/0156023 A1 Jun. 30, 2011

(30) Foreign Application Priority Data

Dec. 25, 2009 (JP) ................................ 2009-295335

(51) Int. Cl.
*H01L 29/12* (2006.01)
*H01L 29/788* (2006.01)
*H01L 21/336* (2006.01)

(52) U.S. Cl.
USPC 257/43; 257/316; 257/E21.681; 257/E29.304; 438/104; 438/266

(58) Field of Classification Search ............... 257/43, 257/316, E29.304, E21.681; 438/104, 266
See application file for complete search history.

(56) References Cited

U.S. PATENT DOCUMENTS

| 4,466,081 A | 8/1984 | Masuoka |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility Zno Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Evan Pert
(74) *Attorney, Agent, or Firm* — Eric J. Robinson; Robinson Intellectual Property Law Office, P.C.

(57) ABSTRACT

In a semiconductor device using a nonvolatile memory, high speed erasing operation and low power consumption are realized. In a nonvolatile memory in which a channel formation region, a tunnel insulating film, and a floating gate are stacked in this order, the channel formation region is formed using an oxide semiconductor layer. In addition, a metal wiring for erasing is provided in a lower side of the channel formation region so as to face the floating gate. With the above structure, when erasing operation is performed, charge accumulated in the floating gate is extracted to the metal wiring through the channel formation region. Consequently, high speed erasing operation and low power consumption of the semiconductor device can be realized.

32 Claims, 18 Drawing Sheets

U.S. PATENT DOCUMENTS

| | | | |
|---|---|---|---|
| 7,115,941 B2 | 10/2006 | Kato | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,550,334 B2 | 6/2009 | Kato et al. | |
| 7,674,650 B2 | 3/2010 | Akimoto et al. | |
| 7,732,819 B2 | 6/2010 | Akimoto et al. | |
| 7,994,588 B2 * | 8/2011 | Yin et al. | 257/390 |
| 8,293,661 B2 * | 10/2012 | Yamazaki | 438/787 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |

FOREIGN PATENT DOCUMENTS

| | | |
|---|---|---|
| JP | 57-105889 | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-324857 | 11/2002 |
| JP | 2003-086000 A | 3/2003 |
| JP | 2003-086808 A | 3/2003 |
| JP | 2004-103957 A | 4/2004 |
| JP | 2004-200377 | 7/2004 |
| JP | 2004-273614 A | 9/2004 |
| JP | 2004-273732 A | 9/2004 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of Igzo Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=in,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous Gizo (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using Igzo Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem Oleds,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA Amoled Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA Amoled Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for Amoled Backplane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission Amoled Display on Plastic Film and Its Bending Properties,", SID Digest '09 : SID International Symposium Digest of Technical Papers, May 31, 2009, pp. 983-985.

Sakata.J et al., "Development of 4.0-In. Amoled Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size Amoled,", AM-FPD '08 Digest of Technical Papers, Jul. 2, 2008, pp. 275-278.

Park.S et al., "Challenge to Future Displays: Transparent AM-OLED Driven by Peald Grown Zno TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (Zno TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA Amoled Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AMOLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of Zno Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method thereof. In particular, the present invention relates to a semiconductor device using a nonvolatile memory such as a NOR flash memory and a NAND flash memory and a manufacturing method of the semiconductor device.

2. Description of the Related Art

Semiconductor memory devices (semiconductor memories) using semiconductor elements are roughly classified into a volatile memory that loses its stored data when supply of power is stopped and a nonvolatile memory that can hold its stored data even when supply of power is stopped.

As a typical example of a volatile memory, a dynamic random access memory (DRAM) can be given. A DRAM stores data in such a manner that a transistor included in a storage element is selected and electric charge is stored in a capacitor. Each memory cell of a DRAM includes only one transistor and one capacitor. Thus, cost per storage capacity is low and which is favorable in terms of high integration.

When data is read out, charge of a capacitor is lost in a DRAM. For this reason, writing operation is needed every time data is read. In addition, in the state where the transistor is not selected, charge is lost due to leakage current or the like, so that a data storage period is short. Thus, another writing operation (refresh operation) is needed at predetermined intervals, and it is difficult to reduce power consumption sufficiently. Further, since stored data is lost when supply of power stops, an additional storage device using a magnetic material or an optical material is needed in order to hold the data for a long time.

As another example of a volatile memory, a static random access memory (SRAM) can be given. An SRAM remains stored data with a circuit such as a flip flop. For this reason, refresh operation is not needed and in view of this point, an SRAM is advantageous as compared to a DRAM. However, cost per storage capacity is high because a circuit such as a flip flop is used. As in the case of a DRAM, when supply of power stops, stored data is lost.

As typical examples of a nonvolatile memory, a NOR flash memory and a NAND flash memory can be given. A flash memory includes a memory transistor having a floating gate and a tunnel insulating film between a gate electrode and a channel formation region. Charge is introduced and held into the floating gate through the tunnel insulating film, so that data is stored. Consequently, a flash memory has an advantage that data can be kept extremely for a long period and refresh operation is not needed (for example, see Patent Document 1).

[Reference]
[Patent Document 1] Japanese Published Patent Application No. S57-105889

SUMMARY OF THE INVENTION

In the above-described flash memory, high voltage is applied to a gate electrode when erasing operation is performed. Then, the charge stored in the floating gate is extracted to a source or a drain through the tunnel insulating film. At this time, the charge passes through a region of the tunnel insulating film in the vicinity of an edge of the floating gate. Thus, there is a problem in that erasing operation takes a long time. Also, it is difficult to reduce power consumption of a semiconductor device which is another problem.

An object of the present invention is to realize high speed erasing operation in a semiconductor device including a nonvolatile memory. In addition, another object is to realize low power consumption of a semiconductor device.

An embodiment of the present invention is a semiconductor device including the following components: a metal wiring provided over an insulating surface; an oxide semiconductor layer provided over and in contact with the metal wiring; a first insulating film provided over the oxide semiconductor layer; a floating gate provided over the first insulating film; a second insulating film provided over the floating gate; and a control gate provided over the second insulating film.

Further, another embodiment of the present invention is a semiconductor device including the following components: a control gate provided over an insulating surface; a first insulating film provided over the control gate; a floating gate provided over the first insulating film; a second insulating film provided over the floating gate; an oxide semiconductor layer provided over the second insulating film; and a metal wiring provided over and in contact with the oxide semiconductor layer.

In the semiconductor device, the oxide semiconductor layer preferably includes an oxide semiconductor having n-type conductivity.

In the semiconductor device, the oxide semiconductor layer preferably includes an oxide semiconductor containing In, Ga, Zn, and O.

In the semiconductor device, the metal wiring preferably contains Al or Cu.

In the semiconductor device, the width of the metal wiring is preferably larger than or equal to the width of the floating gate.

In the semiconductor device, the metal wiring is preferably provided so as to overlap with the floating gate, and both edges of the metal wiring are preferably aligned with or on an outer side than both edges of the floating gate.

In the semiconductor device, the width of the metal wiring is preferably smaller than the width of the floating gate.

In the semiconductor device, the metal wiring is preferably provided so as to overlap with the floating gate, and both edges of the metal wiring are preferably on an inner side than both edges of the floating gate.

Another embodiment of the present invention is a method for manufacturing a semiconductor device including the following steps: forming a metal wiring over an insulating surface; forming an oxide semiconductor layer over the metal wiring; forming a first insulating film over the oxide semiconductor layer; forming a floating gate over the first insulating film; forming a second insulating film over the floating gate; and forming a control gate over the second insulating film.

Further, another embodiment of the present invention is a method for manufacturing a semiconductor device including the following steps: forming a control gate over an insulating surface; forming a first insulating film over the control gate; forming a floating gate over the first insulating film; forming a second insulating film over the floating gate; forming an oxide semiconductor layer over the second insulating film; and forming a metal wiring over the oxide semiconductor layer.

In the method for manufacturing a semiconductor device, the oxide semiconductor layer preferably includes an oxide semiconductor having n-type conductivity.

In the method for manufacturing a semiconductor device, the oxide semiconductor layer preferably includes an oxide semiconductor containing In, Ga, Zn, and O.

In the method for manufacturing a semiconductor device, the metal wiring preferably contains Al or Cu.

In the method for manufacturing a semiconductor device, the width of the metal wiring is preferably larger than or equal to the width of the floating gate.

In the method for manufacturing a semiconductor device, the metal wiring is provided so as to overlap with the floating gate, and both edges of the metal wiring are preferably aligned with or on an outer side than both edges of the floating gate.

In the method for manufacturing a semiconductor device, the width of the metal wiring is preferably smaller than the width of the floating gate.

In the method for manufacturing a semiconductor device, the metal wiring is provided so as to overlap with the floating gate, and both edges of the metal wiring are preferably on an inner side than both edges of the floating gate.

According to one of the embodiments of the present invention, high speed erasing operation and low power consumption of a semiconductor device can be realized.

DETAILED DESCRIPTION OF THE INVENTION

Figure 1:
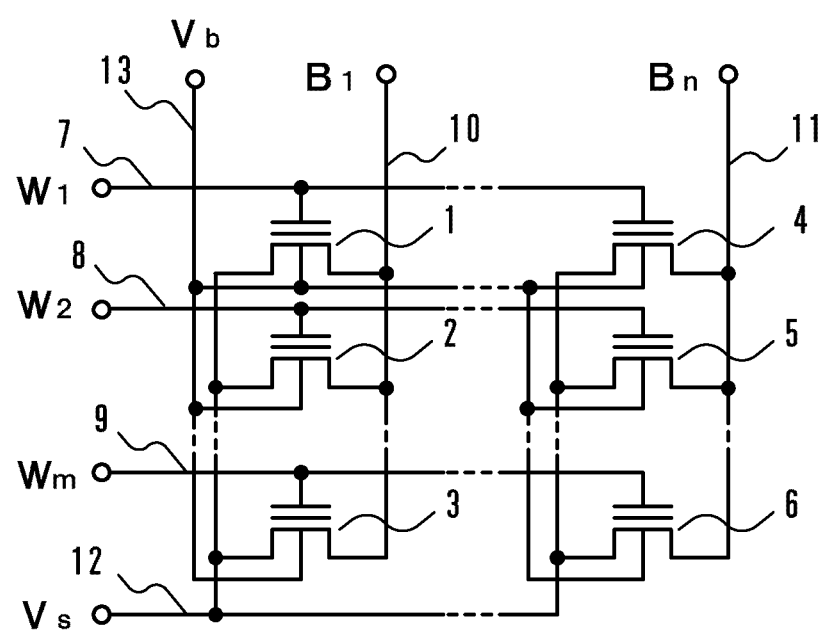
FIG. 1 is a circuit diagram of a semiconductor device in Embodiment 1.

Hereinafter, examples of embodiments of the present invention will be described with reference to the drawings. Note that the present invention is not limited to the following description and it will be easily understood by those skilled in the art that modes and details can be modified in various ways without departing from the spirit and the scope of the present invention. Thus, the present invention should not be construed as being limited to the description shown in the following embodiments.

Note that for the easy understanding, the position, size, range and the like of each component illustrated in the drawings are not actual ones in some cases. Thus, the present invention is not limited to the position, size, range and the like disclosed in the drawings. Further, things that are substantially the same or corresponding to each other are denoted by the same reference numerals in all of the drawings, and repeated description is omitted.

(Embodiment 1)

A structure of a semiconductor device according to an embodiment of the present invention is described. In this embodiment, an example of applying the structure to a semiconductor device including a NOR flash memory is described.

A circuit diagram of a NOR flash memory is shown in FIG. 1. As shown in FIG. 1, m rows and n columns (m and n are integers larger than or equal to one) of memory thin film transistors (hereinafter referred to as "memory TFTs") 1 to 6 are arranged in matrix. The memory TFTs 1 to 3 are arranged in the first column of the matrix and the memory TFTs 4 to 6 are arranged in an n-th column of the matrix.

Gates of the memory TFTs 1 and 4 in the first row are connected to a word line 7. The word line 7 is used as a control gate of these memory TFTs. Similarly, gates of the memory TFTs 3 and 6 in an m-th row are connected to a word line 9. The word line 9 is used as a control gate of these memory TFTs.

Drains of the memory TFTs 1 to 3 in the first column are connected to a bit line 10. The bit line 10 is used for applying voltage between sources and the drains of these memory TFTs. Drains of the memory TFTs 4 to 6 in the n-th column are connected to a bit line 11. The bit line 11 is used for applying voltage between sources and the drains of these memory TFTs. The sources of the memory TFTs 1 to 6 are connected to a source line 12. An erasing wiring 13 is connected to the memory TFTs 1 to 6. A terminal $V_b$ is connected to the erasing wiring 13. The erasing wiring 13 is used for extracting charge stored in the memory TFTs 1 to 6 when erasing operation of the semiconductor device is performed.

Figure 2:
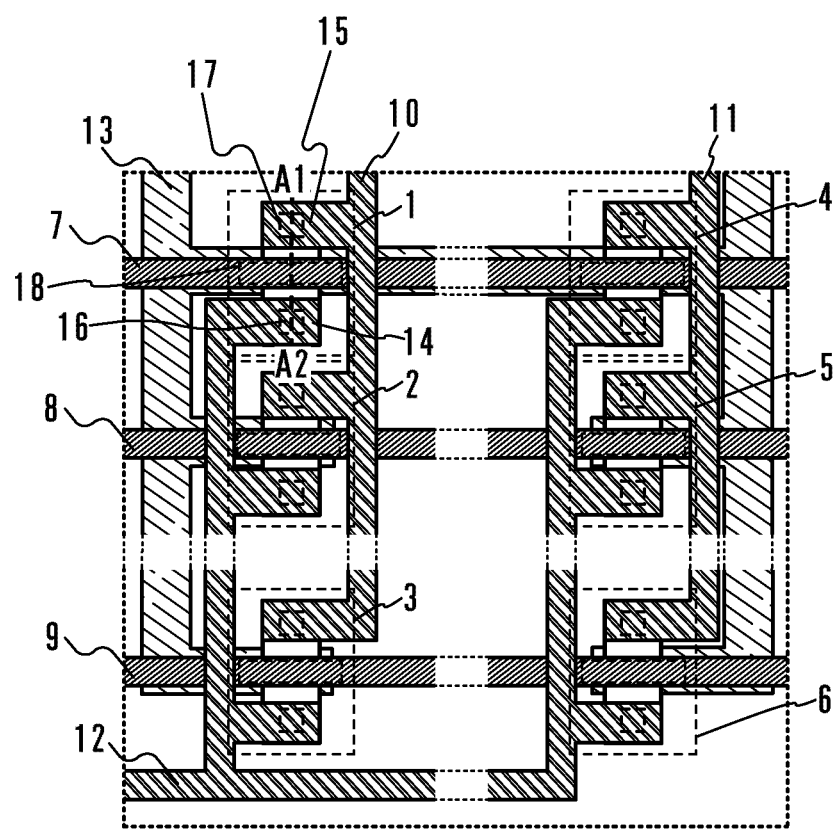
FIG. 2 is a layout of a semiconductor device in Embodiment 1.

A layout corresponding to the circuit diagram in FIG. 1 is shown in FIG. 2. As shown in FIG. 2, a source 14 and a drain 15 are provided in the memory TFT 1. The source 14 is connected to the source line 12 through a contact hole 16. The drain 15 is connected to the bit line 10 through a contact hole 17. A floating gate 18 and the word line 7 are provided so as to be over and across the source 14 and the drain 15. In the memory TFT 1, the erasing wiring 13 is provided so as to overlap with the word line 7 and the floating gate 18. In the same manner, the memory TFTs 2 to 6 are formed.

Figure 3:
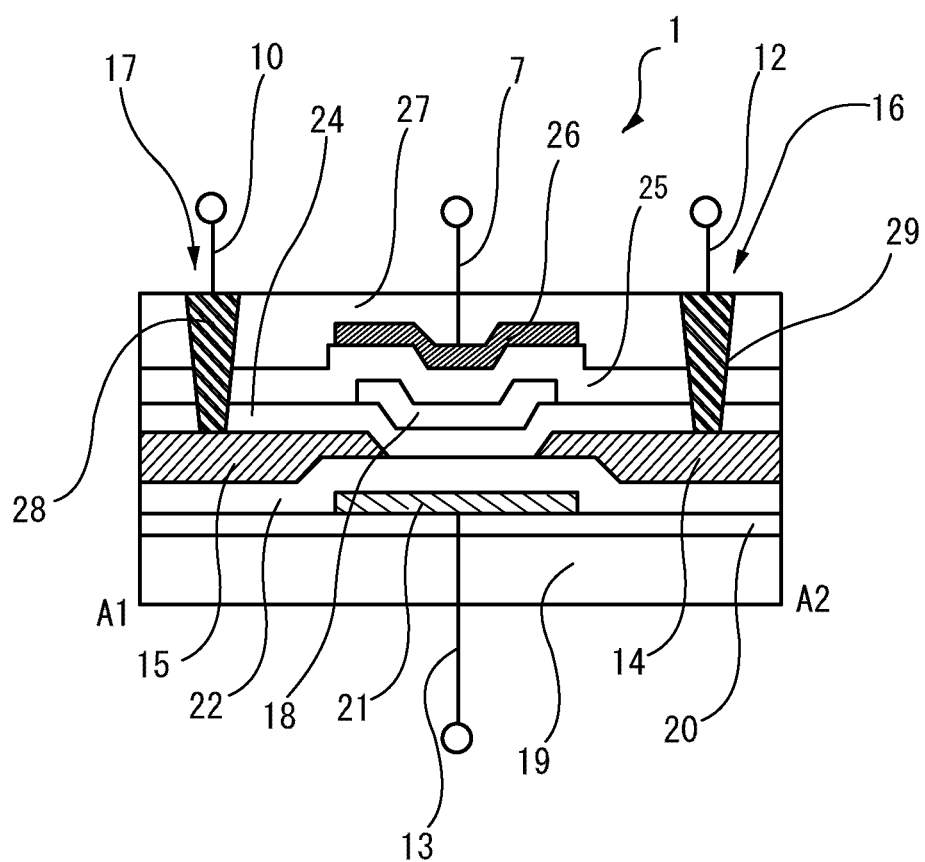
FIG. 3 is a cross-sectional view of a semiconductor device in Embodiment 1.

Next, a schematic cross-sectional view taken along a line A1-A2 of the memory TFT 1 shown in FIG. 2 is shown in FIG. 3. As shown in FIG. 3, a base insulating film 20 is provided over an insulating substrate 19. A metal wiring 21 is provided over the base insulating film 20. The metal wiring 21 corresponds to the erasing wiring 13 shown in FIG. 1 and FIG. 2.

For the metal wiring 21, a material with low resistivity, for example, a metal with low resistivity such as Al or Cu can be preferably used. When the metal wiring 21 is formed with such a metal, wiring resistance can be reduced and power consumption in erasing operation of the semiconductor device can be decreased.

An oxide semiconductor layer 22 is provided in contact with a top surface and side surfaces of the metal wiring 21. As an oxide semiconductor, an oxide semiconductor containing In, Ga, Zn, and O (In—Ga—Zn—O-based oxide semiconductor) is used, for example. Alternatively, the following oxide semiconductor may be used: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; a Zn—O-based oxide semiconductor; or the like.

Note that for example, "In—Ga—Zn—O-based oxide semiconductor" in this specification means an oxide semiconductor containing at least In, Ga, and Zn as metal elements and there is no limitation on the relative proportion. Further, the In—Ga—Zn—O-based oxide semiconductor may contain an element other than In, Ga, Zn, and O.

The source 14 and the drain 15 are provided in contact with the oxide semiconductor layer 22. The source 14 and the drain 15 are preferably formed using an appropriate conductive material such as a metal material or an oxide semiconductor material. A material of the source 14 and the drain 15 may be selected in consideration of the work function, the electron affinity, or the like of the material and the electron affinity of the oxide semiconductor included in the oxide semiconductor layer 22.

A first insulating film (tunnel insulating film) 24 is provided to cover the oxide semiconductor layer 22, the source 14, and the drain 15. The floating gate 18 is provided over the first insulating film 24 so as to overlap with the source 14 and the drain 15. A second insulating film (gate insulating film) 25 is provided on a top surface of the floating gate 18. A control gate 26 is provided over the second insulating film 25 so as to face the floating gate 18.

An interlayer insulating film 27 is formed over the second insulating film 25 and the control gate 26. The contact hole 16 and the contact hole 17 reaching the source 14 and the drain 15 respectively through the interlayer insulating film 27, the second insulating film 25, and the first insulating film 24 are provided. Metal films 29 and 28 fill the contact holes 16 and 17 respectively. The metal film 28 and the metal film 29 are connected to the bit line 10 and the source line 12 respectively.

Here, a transistor including an oxide semiconductor having metallic bonding is briefly described. In the case of a transistor including an oxide semiconductor, it is technically difficult to make a semiconductor having n-type conductivity or p-type conductivity by adding an impurity, unlike in the case of a general transistor including silicon. Then, as shown in FIG. 3, the source 14 and the drain 15 including an appropriate conductive material such as a metal material or an oxide semiconductor material are formed in contact with the oxide semiconductor layer 22, whereby a function of a transistor can be obtained.

For example, when the source 14 and the drain 15 are formed using a metal material, a material whose work function is almost equal to electron affinity of the oxide semiconductor included in the oxide semiconductor layer 22 is used for portions of the source 14 and the drain 15, which are in contact with the oxide semiconductor layer 22, so that an n-channel transistor is obtained. In that case, the electron carrier concentration of the oxide semiconductor is preferably less than $1 \times 10^{16}$ cm$^{-3}$ or the hole carrier concentration thereof is preferably $1 \times 10^{16}$ cm$^{-3}$ or more. When the electron carrier concentration is $1 \times 10^{16}$ cm$^{-3}$ or more, a large amount of current flows between the source and the drain even in the state where a bias is not applied to a gate (the state where potentials of the gate and the source are equal), in other words, the transistor becomes a so-called normally-on transistor.

On the other hand, when the electron carrier concentration is decreased and the hole carrier concentration is increased, a flow of current between the source and the drain is suppressed in the state where a bias is not applied to the gate, so that the transistor becomes a so-called normally-off transistor and the threshold value thereof is positive. If influence of the gate is negligible, the threshold value increases as the hole carrier concentration is increased.

In the same manner, a material whose work function is almost equal to the sum of the electron affinity and the band gap of the oxide semiconductor is used as a material included in the source 14 and the drain 15, whereby a p-channel transistor is obtained.

Based on the above, operation of a NOR flash memory described in this embodiment is described. Here, a circuit including an n-channel memory TFT is described. The case where a p-channel memory TFT is used can be understood by switching positive and negative polarities of a voltage to be applied; therefore, the description is omitted.

In the memory TFT 1 shown in FIG. 2 and FIG. 3, charge is accumulated in the floating gate 18, so that data can be stored. Here, the state where writing to the memory TFT 1 is performed and charge is accumulated in the floating gate 18 is expressed as a state "1". The state where charge is not accumulated in the floating gate 18 is expressed as a state "0".

In the case where the memory TFT 1 is turned on so that current flows between the source and the drain, gate voltages, in other words, threshold voltages needed to turn on the memory TFT 1 are different between the states "1" and "0". Specifically, in the state "1", an electric field is generated by the charge accumulated in the floating gate 18, so that the threshold voltage is higher than that of in the state "0". Here, the threshold voltage in the state "1" and the threshold voltage in the state "0" are assumed to be 6 V and 3 V respectively.

First, writing operation is described. Here, the case is described in which the memory TFTs 1 to 6 are in the state "0" in an initial state and the state of the memory TFT 1 is changed to the state "1" by performing writing operation.

First, the source line 12 shown in FIG. 1 is connected to GND (a ground terminal). Next, a positive voltage (for example, +8 V) is applied to the bit line 10 and a positive voltage (for example, +12 V) is applied to the word line 7. Connected to GND are (n−1) bit lines other than the bit line 10 and (m−1) word lines other than the word line 7.

When the voltage is applied to the bit line 10 and the word line 7, the memory TFT 1 shown in FIG. 3 is turned on, whereby a channel is formed in the oxide semiconductor layer 22. Then, current flows between the source 14 and the drain 15. At this time, a high electric field is generated in the channel near the drain 15. Charge is introduced into the floating gate 18 due to this high electric field. Consequently, the memory TFT 1 comes to be in the state "1".

Next, reading operation is described. An example of reading data from the memory TFT 1 shown in FIG. 1 is described.

First, the source line 12 is connected to GND. Next, the (m−1) word lines other than the word line 7 are connected to GND. Thus, the memory TFTs 2, 3, 5, and 6 which are not connected to the word line 7 are turned off.

Next, a voltage of 5 V is applied to the word line 7 and a voltage of 1 V is applied to the bit line 10. Here, when the memory TFT 1 is in the state "1", the threshold voltage is 6 V. In this case, the memory TFT 1 is off and current does not flow between the source and the drain. When the memory TFT 1 is in the state "0", the threshold voltage is 3 V. In this case, the memory TFT 1 is on and current flows between the source and the drain. In such a manner, current flowing between the source and the drain of the memory TFT 1 is detected, so that whether the memory TFT 1 is in the state "1" or the state "0" can be read out.

Next, erasing operation is described. Here, a method of changing the state "1" into the state "0" by extracting charge accumulated in the memory TFT 1 is described. First, the bit line 10 and the source line 12 are brought into a floating state. Next, a negative voltage (for example, −20 V) is applied to the control gate 26 and a positive voltage (for example, +3 V) is applied to the metal wiring 21. Thus, an electric field is generated between the metal wiring 21 and the control gate 26.

Figure 4:
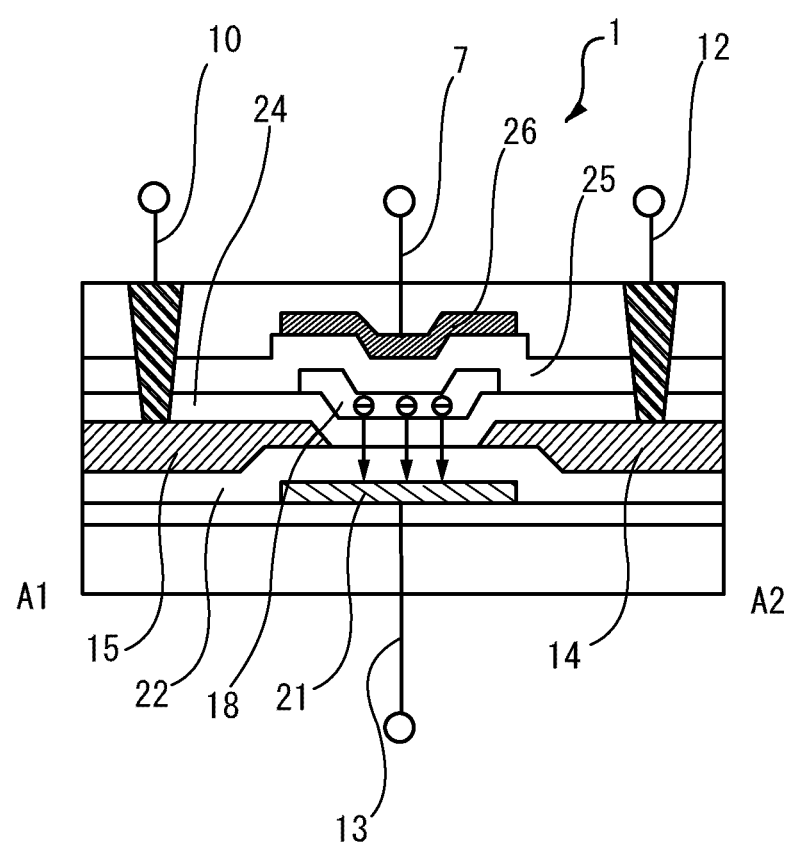
FIG. 4 is a cross-sectional view of a semiconductor device in Embodiment 1.

Consequently, tunnel current flows between the floating gate 18 and the oxide semiconductor layer 22 due to the above electric field as shown in FIG. 4. For this reason, the charge accumulated in the floating gate 18 flows into the metal wiring 21 through the first insulating film 24 and the oxide semiconductor layer 22. In such a manner, the erasing operation of the memory TFT 1 is performed.

Note that here, in introducing and erasing charge to the floating gate as described above, extremely high voltage is used for a semiconductor circuit. In a silicon semiconductor used conventionally, there is a problem of hot carrier degradation and the like due to application of such a high voltage. Generation of hot carriers depends on the depth of a band gap. An oxide semiconductor containing Zn has a band gap of 3 eV or more and the probability of generation of hot carriers is extremely low compared to a silicon semiconductor; thus, such an oxide semiconductor has an advantage that a stable operation can be kept even when high voltage is applied.

In the conventional techniques, charge is extracted from a floating gate to a drain, so that erasing operation is performed. Specifically, charge is extracted from an edge portion of the floating gate 18 toward the drain 15 through the first insulating film 24. In contrast, in this embodiment, the metal wiring 21 is provided so as to face the floating gate 18 with the oxide semiconductor layer 22 and the first insulating film 24 interposed therebetween as shown in FIG. 4; thus, charge is extracted toward the entire surface of the metal wiring 21 facing the floating gate 18, when erasing operation is performed. Thus, charge can be extracted in a short time compared to the conventional techniques. Consequently, time required for erasing operation can be shortened.

In the case where an impurity layer provided over a semiconductor substrate is used as an erasing wiring like in the conventional techniques, power consumption is large because wiring resistance is high. On the other hand, in a structure shown in FIG. 3 and FIG. 4, a metal material with low resistance is used as an erasing wiring (the metal wiring 21). Accordingly, power consumption of the semiconductor device at the time when erasing operation is performed can be reduced.

Figure 5:
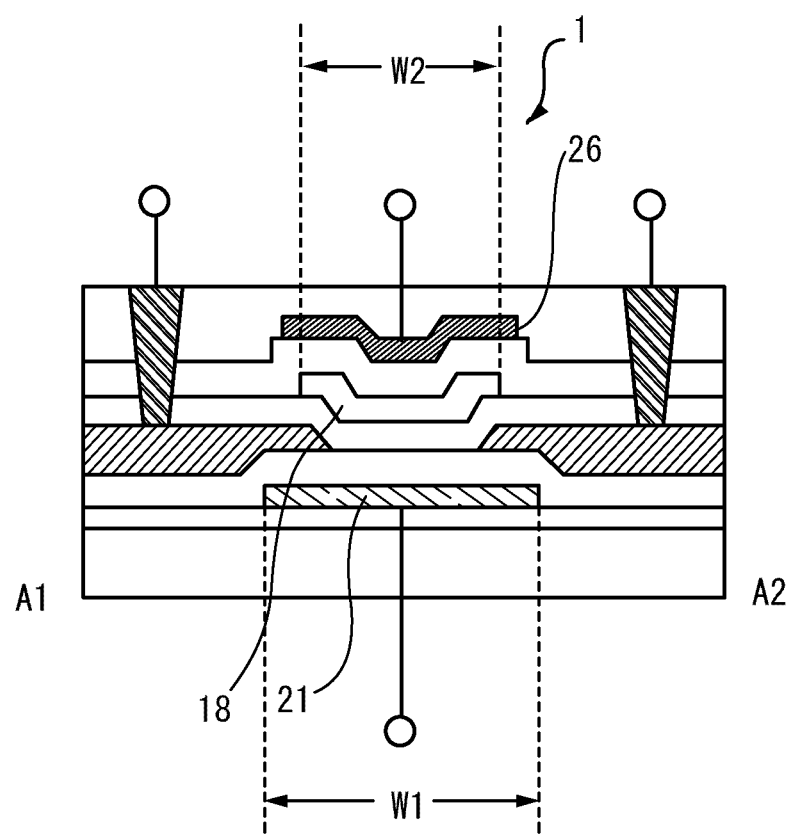
FIG. 5 is a cross-sectional view of a semiconductor device in Embodiment 1.

Further, in this embodiment, the memory TFT 1 is formed so that the width W1 of the metal wiring 21 is larger than the width W2 of the floating gate 18 as shown in FIG. 5. Specifically, the metal wiring 21 is formed so as to overlap with the floating gate 18. Also, the metal wiring 21 is formed to have both edges on an outer side than those of the floating gate 18. That is, a region of the first insulating film 24 in the vicinity of the edges of the floating gate 18 overlaps with the metal wiring 21.

The above structure is employed, whereby the floating gate 18 is provided with its entire surface facing the metal wiring 21. Thus, charge accumulated in the floating gate 18 is rapidly extracted to the metal wiring 21. Consequently, time required for erasing operation can be effectively shortened.

Figure 6:
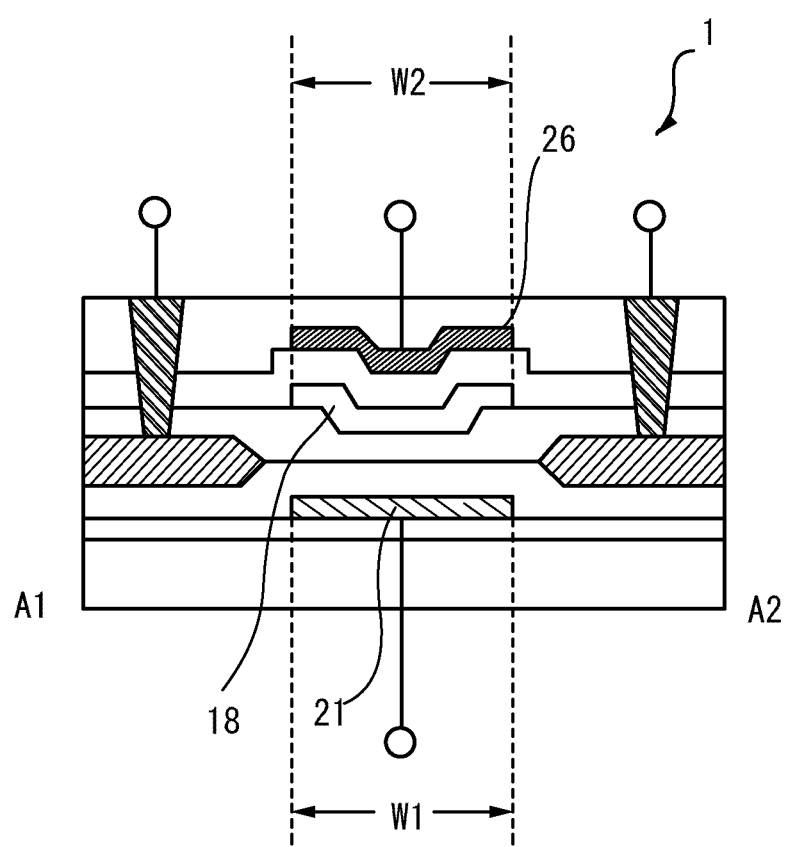
FIG. 6 is a cross-sectional view of a semiconductor device in Embodiment 1.

Alternatively, as shown in FIG. 6, the width W1 of the metal wiring 21 and the width W2 of the floating gate 18 may be the same. Specifically, the metal wiring 21 may be formed so as to overlap with the floating gate 18 with both of its edges and the both edges of the floating gate 18 are aligned. Even such a structure, the same effect as that of the structure shown in FIG. 5 can be obtained.

In this embodiment, the first insulating film 24 and the metal wiring 21 are formed so as to face each other with the oxide semiconductor layer 22 interposed therebetween. Thus, analysis of interface state density at the interface between the oxide semiconductor layer 22 and the first insulating film 24 (a charge pumping method) can be carried out. As a result, evaluation of reliability of the semiconductor device can be effectively performed.

As described above, with the structure shown in this embodiment, high speed erasing operation of a semiconductor device compared to the conventional techniques can be realized. Additionally, low power consumption of the semiconductor device can be achieved. Evaluation of reliability of a semiconductor device can be effectively performed.

(Embodiment 2)

In this embodiment, a modified example of Embodiment 1 is described. The case where the width of the metal wiring 21 is larger than or equal to the width of the floating gate 18 (see FIG. 5 and FIG. 6) is described in Embodiment 1. In this embodiment, an example is described in which the width of the metal wiring 21 is smaller than the width of the floating gate 18.

Figure 7:
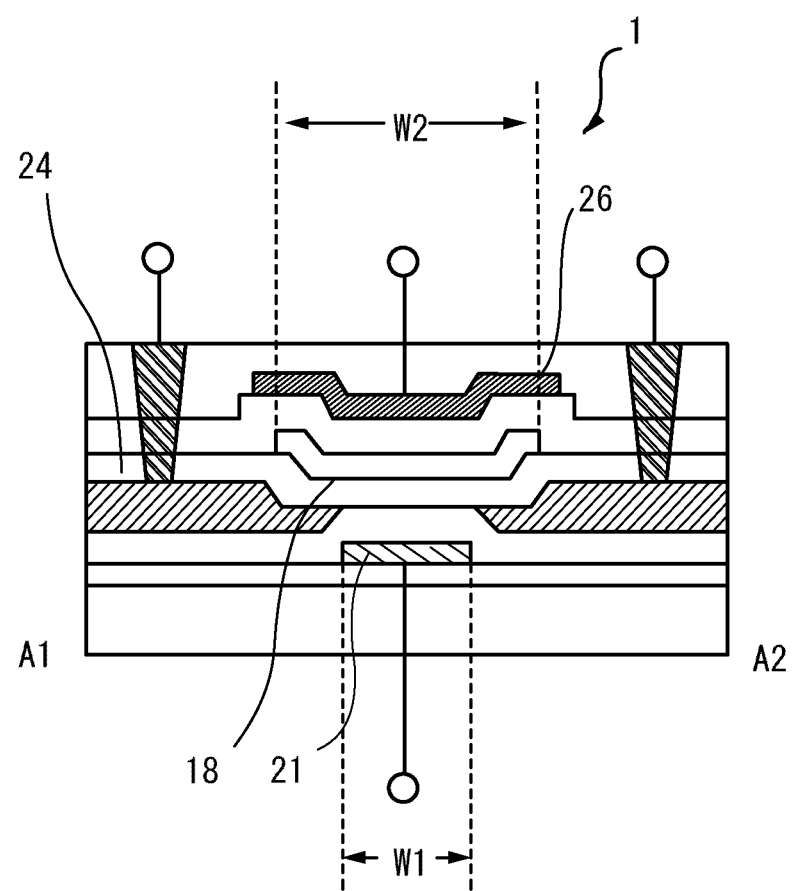
FIG. 7 is a cross-sectional view of a semiconductor device in Embodiment 2.

As shown in FIG. 7, the width W1 of the metal wiring 21 is formed to be smaller than the width W2 of the floating gate 18 in the memory TFT 1. Specifically, the metal wiring 21 is formed so as to overlap with the floating gate 18. Also, the metal wiring 21 is formed to have both edges located on an inner side than the both edges of the floating gate 18. That is, a region of the first insulating film 24 in the vicinity of the edge of the floating gate 18 does not overlap with the metal wiring 21.

Figure 8:
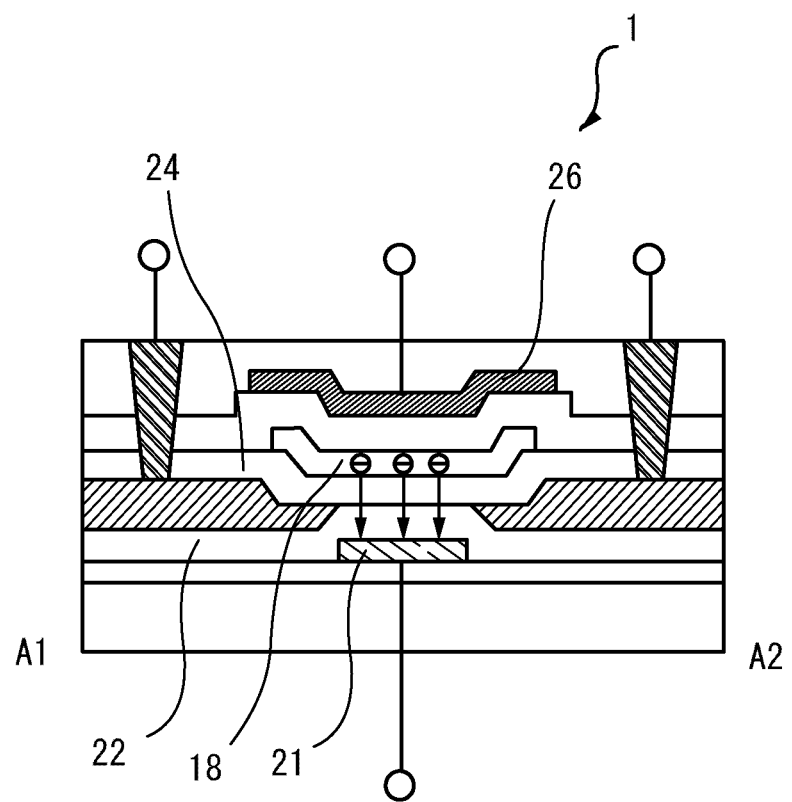
FIG. 8 is a cross-sectional view of a semiconductor device in Embodiment 2.

Next, the case where erasing operation is performed by the memory TFT 1 shown in FIG. 7 is described. As shown in FIG. 8, when the erasing operation is performed, charge stored in the floating gate 18 flows into the metal wiring 21 through the first insulating film 24 and the oxide semiconductor layer 22. At this time, the charge passes through a region of the first insulating film 24 which is located on an inner side than the both edges of the floating gate 18.

Here, when high voltage is applied to the control gate 26, dielectric breakdown is easily caused due to a concentration of an electric field in the region of the first insulating film 24 in the vicinity of the edge of the floating gate 18. In this embodiment, the structure shown in FIG. 7 is employed, whereby when the erasing operation is performed, the charge does not pass through the region of the first insulating film 24 in the vicinity of the edge of the floating gate 18. Thus, dielectric breakdown due to a concentration of an electric field can be suppressed. As a result, deterioration in characteristics of the memory TFT can be suppressed and the number of rewriting operations can be increased. Further, reliability of the semiconductor device can be improved. Other structures and effects are similar to Embodiment 1; thus, description thereof is omitted.

In this embodiment, deterioration of the memory TFT can be suppressed and the number of rewriting operations can be increased in addition to the effect obtained in Embodiment 1. Further, reliability of the semiconductor device can be improved.

(Embodiment 3)

A structure of a semiconductor device according to an embodiment of the present invention is described. In this embodiment, an example of applying the structure to a semiconductor device including a NAND flash memory is described.

Figure 9:
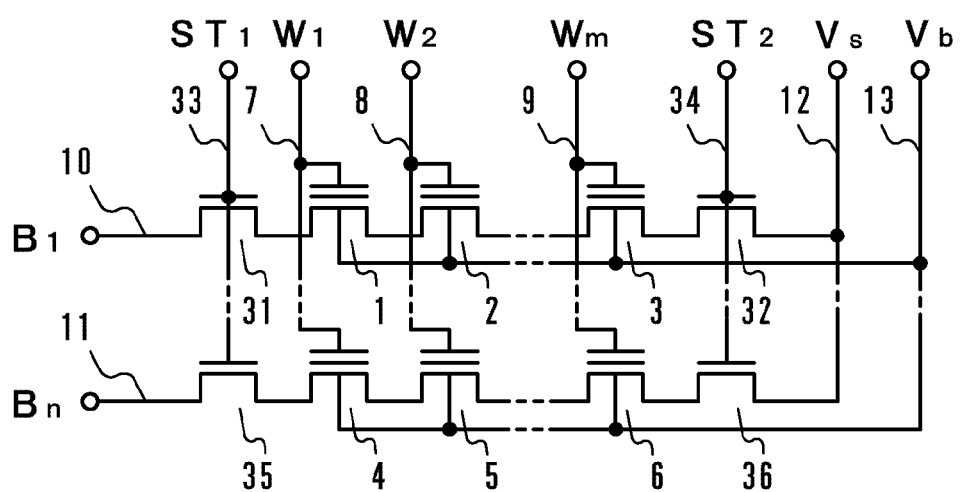
FIG. 9 is a circuit diagram of a semiconductor device in Embodiment 3.

A circuit diagram of a NAND flash memory is shown in FIG. 9. As shown in FIG. 9, memory TFTs 1 to 6 are arranged in m rows and n columns (m and n are integers larger than or equal to one) in matrix. In the first row of the matrix, memory TFTs 1, 2, and 3 are connected in series. One terminal (a terminal on the left side) of the memory TFT 1 is connected to one terminal (a terminal on the right side) of a selection thin film transistor (hereinafter referred to as a "selection TFT") 31. One terminal (a terminal on the right side) of the memory TFT 3 is connected to one terminal (a terminal on the left side) of a selection TFT 32. The other terminal (a terminal on the left side) of the selection TFT 31 is connected to a bit line 10. The other terminal (a terminal on the right side) of the selection TFT 32 is connected to a source line 12. The bit line 10 is connected to a terminal $B_1$. The source line 12 is connected to a terminal $V_s$. Gates of the selection TFTs 31 and 32 are connected to selection lines 33 and 34 respectively. The selection lines 33 and 34 are connected to terminals $ST_1$ and $ST_2$ respectively.

In an n-th row of the matrix, memory TFTs 4, 5, and 6 are connected in series. One terminal (a terminal on the left side) of the memory TFT 4 is connected to one terminal (a terminal on the right side) of a selection TFT 35. One terminal (a terminal on the right side) of the memory TFT 6 is connected to one terminal (a terminal on the left side) of a selection TFT 36. The other terminal (a terminal on the left side) of the selection TFT 35 is connected to a bit line 11. The other terminal (a terminal on the right side) of the selection TFT 36 is connected to the source line 12. The bit line 11 is connected to a terminal $B_n$. Gates of the selection TFTs 35 and 36 are connected to the selection lines 33 and 34 respectively.

Gates of the memory TFTs 1 and 4 are connected to a word line 7. The word line 7 is connected to a terminal $W_1$. In the same manner, gates of the memory TFTs 3 and 6 are connected to a word line 9. The word line 9 is connected to a terminal $W_m$.

Channel formation regions of the memory TFTs 1 to 6 are connected to an erasing wiring 13. The erasing wiring 13 is connected to the terminal $V_b$.

In the memory TFT 1 shown in FIG. 9, charge is accumulated in the floating gate, so that data can be stored, similarly to the NOR flash memory described in Embodiment 1.

Figure 10:
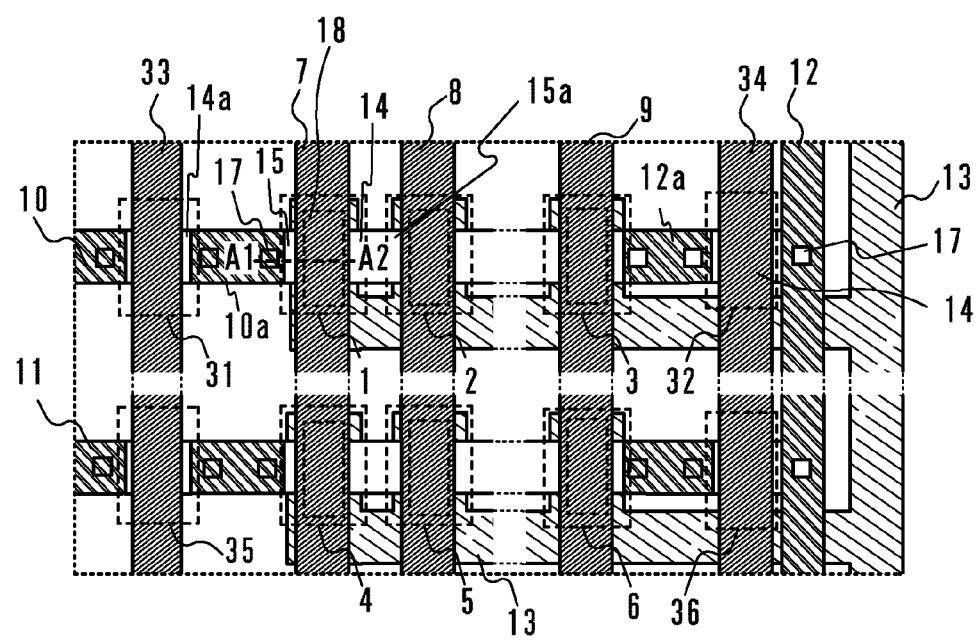
FIG. 10 is a layout of a semiconductor device in Embodiment 3.

A layout corresponding to the circuit diagram in FIG. 9 is shown in FIG. 10. As shown in FIG. 10, a source 14 and a drain 15 are provided in the memory TFT 1. The source 14 in the memory TFT 1 is connected to a drain 15a in the memory TFT 2. The drain 15 in the memory TFT 1 is connected to a source 14a in the selection TFT 31. A floating gate 18 and the word line 7 are provided so as to be over and across the source 14 and the drain 15 of the memory TFT1. In the memory TFT 1, the erasing wiring 13 is provided so as to overlap with the word line 7 and the floating gate 18. In the same manner, the memory TFTs 2 to 6 are formed.

Figure 11:
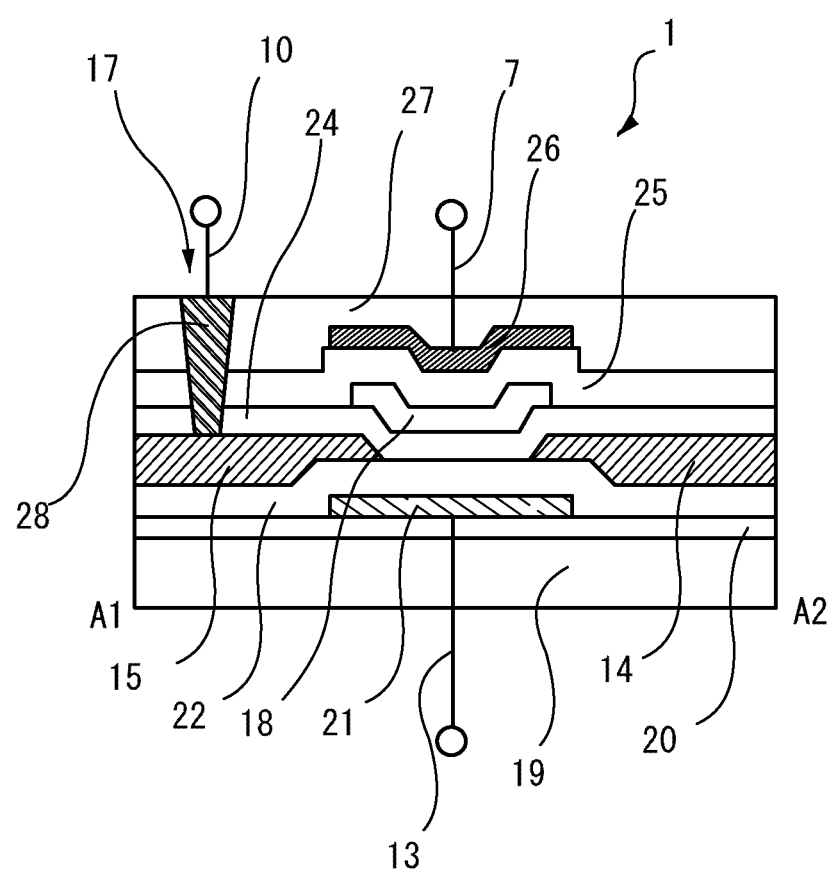
FIG. 11 is a cross-sectional view of a semiconductor device in Embodiment 3.

A cross-sectional view taken along a line A1-A2 in FIG. 10 is shown in FIG. 11. As shown in FIG. 11, the memory TFT 1 is connected to the adjacent selection TFT 31 through the drain 15 (see FIG. 10). The memory TFT 1 is connected to the adjacent memory TFT 2 through the source 14 (see FIG. 10). The contact hole 16 and the metal film 29 described in Embodiment 1 (see FIG. 3) are not provided. Other structures in FIG. 11 are similar to FIG. 3; thus, description thereof is omitted.

Next, writing operation of the circuit shown in FIG. 9 is described. Here, an example of writing data to one row is described. The state "1" is written only to the memory TFT 1 of the memory TFTs 1 and 4 connected to the word line 7, and the state "0" is written to other (n−1) memory TFTs.

As in Embodiment 1, the state where writing is performed to the memory TFT 1 and charge is accumulated in a floating gate is expressed as a state "1". The state where charge is not accumulated in the floating gate is expressed as a state "0". Here, the threshold voltage at the time when the memory TFT 1 is in the state "1" is assumed to be 7 V and the threshold voltage at the time when the memory TFT 1 is in the state "0" is assumed to be 2 V.

First, the source line 12 is connected to GND. The bit line 10 is connected to GND and a voltage of approximately 10 V is applied to the other (n−1) bit lines. A voltage of approximately 12 V is applied to the selection line 33, whereby selection TFTs 31 and 35 are turned on. On the other hand, the selection line 34 is connected to GND, whereby selection TFTs 32 and 36 are turned off.

Next, a high voltage of approximately 20 V is applied to the word line 7 and a voltage of approximately 10 V is applied to the other (m−1) word lines. Then, a high voltage of approximately 20 V is applied between a control gate and a metal wiring in the memory TFT 1 which is one of the n memory TFTs connected to the word line 7. By an electric field due to this high voltage, tunnel current flows between the floating gate and the metal wiring. As a result, charge is introduced into the floating gate and the state "1" is written to the memory TFT 1.

On the other hand, a voltage of approximately 10 V is applied between a control gate and a metal wiring in the n rows and (m−1) columns of memory TFTs connected to the (m−1) word lines. However, tunnel current does not flow by an electric field due to this voltage, so that charge is not introduced into the floating gate. Therefore, charge is not introduced into the floating gate in the memory TFT. In such a manner, data is written to one row.

Next, reading operation is described. Here, an example of reading data in the memory TFT 1 is described. First, the source line 12 is connected to GND. A voltage of approximately 3 V is applied to the selection lines 33 and 34, whereby the selection TFTs 31, 32, 35, and 36 are all turned on. A voltage of approximately 8 V is applied to the (m−1) word lines 8 and 9 other than the word line 7, so that the n rows and (m−1) columns of memory TFTs 2, 3, 5, and 6 connected to these word lines are all turned on.

Next, a voltage of approximately 4 V is applied to the word line 7 and a significantly low voltage (approximately 1 V) is applied to the bit line 10. When the memory TFT 1 is in the state "1", the memory TFT 1 remains off and current does not flow between the source and the drain. When the memory TFT 1 is in the state "0", the memory TFT 1 is turned on and current flows between the source and the drain. In such a manner, current flowing between the source and the drain of the memory TFT 1 is detected, so that whether the memory TFT 1 is in the state "1" or in the state "0" can be read out.

Next, erasing operation is described. Here, a method of erasing data all at once which set all of the memory TFTs to state "0" is described. First, the source line 12 and all of the n bit lines 10 and 11 are brought into a floating state. At this time, the selection TFTs 31, 32, 35, and 36 may be on or off.

Subsequently, a voltage of approximately −20 V is applied to all of the m word lines 7 to 9. Further, a voltage of approximately 3 V is applied to the erasing wiring 13. Thus, an electric field is generated between the metal wiring 21 and the control gate 26 which are shown in FIG. 11. As in Embodiment 1, charge stored in the floating gate 18 flows into the metal wiring 21 through the first insulating film 24 and the oxide semiconductor layer 22 due to this electric field. In such a manner, the erasing operation of the memory TFT 1 is performed.

With the above described structure, the same effect as those of Embodiments 1 and 2 can be obtained in a semiconductor device including a NAND flash memory. Other structures are similar to Embodiments 1 and 2; therefore, description thereof is omitted.

As described above, the structure in this Embodiment is employed, whereby the same effect as those of Embodiments 1 and 2 can be obtained in a NAND flash memory circuit.

(Embodiment 4)

In Embodiments 1 to 3, the example of a so-called top-gate structure in which a floating gate and a control gate are provided over a channel formation region and a source and a drain is described. In this embodiment, an example of a so-called bottom-gate structure in which a channel formation region and a source and a drain are provided over a control gate provided over an insulating substrate is described.

Figure 12:
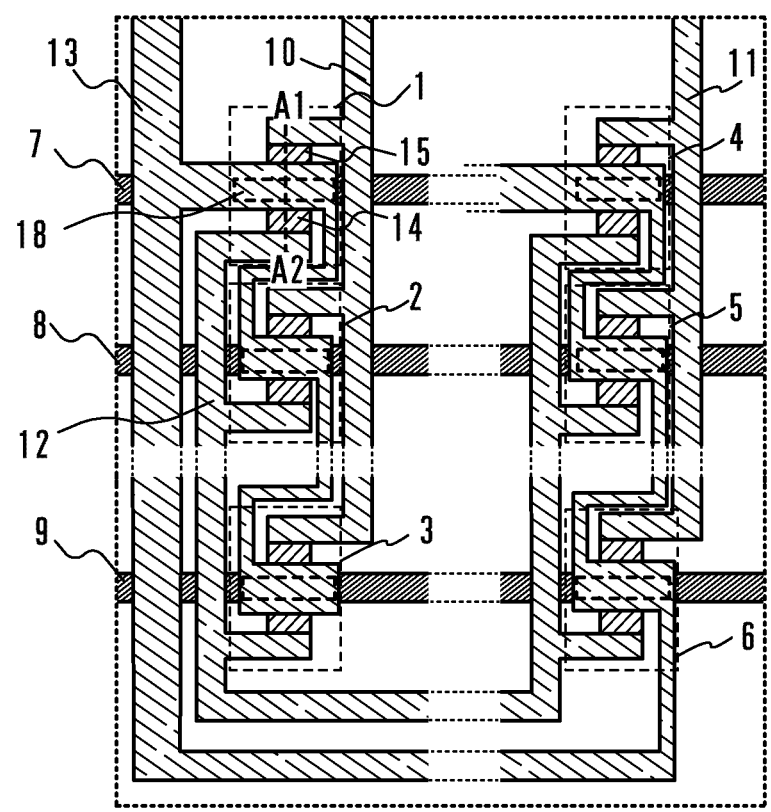
FIG. 12 is a layout of a semiconductor device in Embodiment 4.

A layout of the case where the bottom-gate structure is applied to a NOR flash memory is shown in FIG. 12. In memory TFTs 1 to 6, an erasing wiring 13 is provided so as to meander between a bit line 10 and a source line 12 and to overlap with word lines 7 to 9 and a floating gate of each memory TFT. The erasing wiring 13 is formed in the same layer as the bit line 10 and the source line 12.

Figure 13:
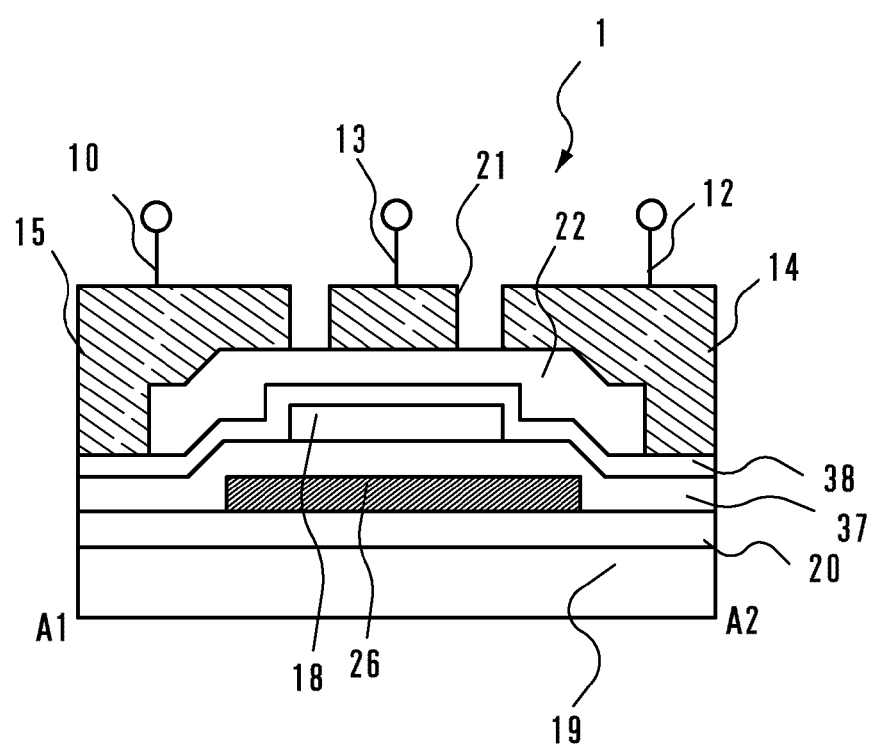
FIG. 13 is a cross-sectional view of a semiconductor device in Embodiment 4.

In addition, a cross-sectional view taken along a line A1-A2 in FIG. 12 is shown in FIG. 13. As shown in FIG. 13, a base insulating film 20 is provided over a surface of an insulating substrate 19. A control gate 26 is provided over the base insulating film 20. A first insulating film (a gate insulating film) 37 is provided over the control gate 26 so as to cover a top surface and side surfaces of the control gate 26. A floating gate 18 is provided over the first insulating film 37. A second insulating film (a tunnel insulating film) 38 is provided over the floating gate 18 so as to cover a top surface and side surfaces of the floating gate 18. An oxide semiconductor layer 22 is provided in a top surface of the second insulating film 38. A metal wiring 21 is provided over the oxide semiconductor layer 22 so as to be in contact with the oxide semiconductor layer 22. The metal wiring 21 corresponds to the erasing wiring 13 shown in FIG. 12.

On both sides of the metal wiring 21, a source 14 and a drain 15 formed including a conductive material such as a metal material or an oxide semiconductor material are provided. As shown in Embodiment 1, an appropriate material to obtain a function of a transistor is selected as a material included in the source 14 and the drain 15. The source 14 is connected to the source line 12. The drain 15 is connected to the bit line 10. Note that the source 14 and the source line 12 may be formed including a different material or may be formed including the same material. The drain 15 and the bit line 10 may be formed including a different material or may be formed including the same material. The same can apply to the metal wiring 21 and the erasing wiring 13. In such a manner, a manufacturing process can be omitted.

Note that the material which is appropriate for a source or a drain of a transistor including an oxide semiconductor is not necessarily a material with low resistivity. When there is no choice but to use a material whose resistivity is not quite low, the material may be used for a portion which is in contact with an oxide semiconductor and the other portion may include a material with low resistivity (for example, aluminum or the like). For example, a first layer may be formed using the material which is appropriate for a source or a drain to have a thickness of 5 nm or more, preferably 20 nm or more, and a second layer may be formed thereover using a material with low resistivity. It is not preferable to form the first layer to have a thickness of less than 5 nm because influence of the second layer expands to the oxide semiconductor layer.

This effect varies depending on a material of the first layer. In general, when a material with a low carrier concentration is used, the first layer needs to have a large thickness to prevent the second layer from affecting the oxide semiconductor layer.

Moreover, the metal wiring 21 can be formed in the same layer as the source 14 and the drain 15. That is, the erasing wiring is formed in the same layer as the bit line and the source line. Accordingly, compared to the structures shown in Embodiments 1 to 3, the number of manufacturing steps of the semiconductor device can be further decreased.

The operation of a NOR flash memory is similar to that in Embodiment 1, so that description thereof is omitted. The case where the width of the metal wiring 21 is larger than or equal to that of the floating gate 18 and an example of the case where the width of the metal wiring 21 is smaller than that of the floating gate 18 are similar to those in Embodiments 1 and 2; thus, description thereof is omitted.

Figure 14:
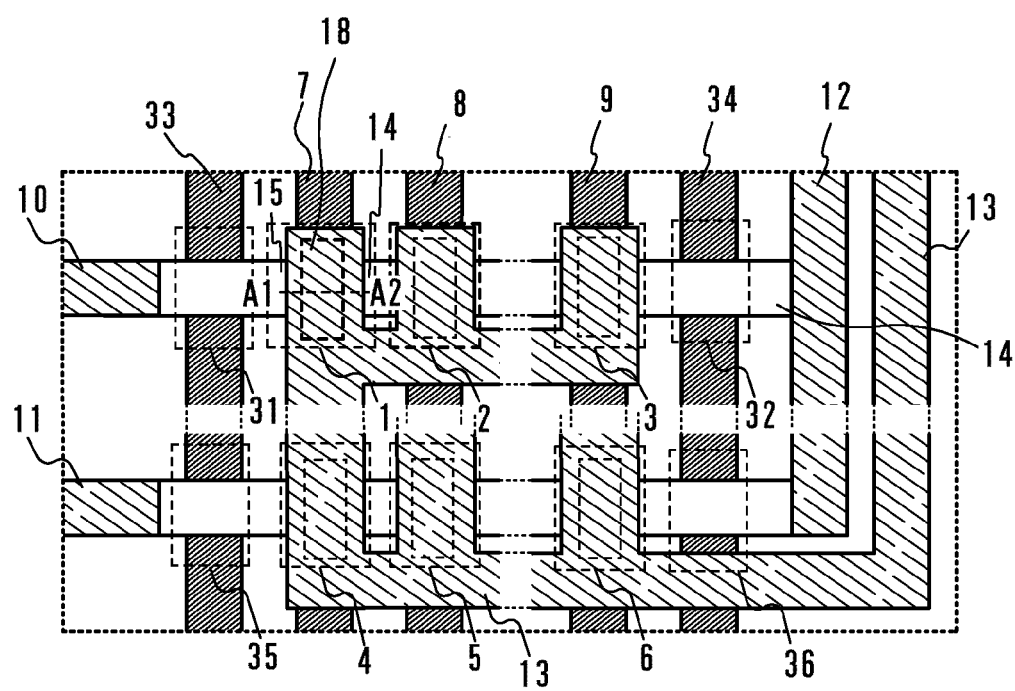
FIG. 14 is a layout of a semiconductor device in Embodiment 4.

Next, a layout of the case where the bottom-gate structure shown in this embodiment is applied to a NAND flash memory is shown in FIG. 14. As shown in FIG. 14, the erasing wiring 13 is formed in the same layer as the bit line 10 and the source line 12. Consequently, even in the case where the structure is applied to a NAND flash memory, the number of manufacturing steps of the semiconductor device can be decreased compared to the structures shown in Embodiments 1 to 3.

Figure 15:
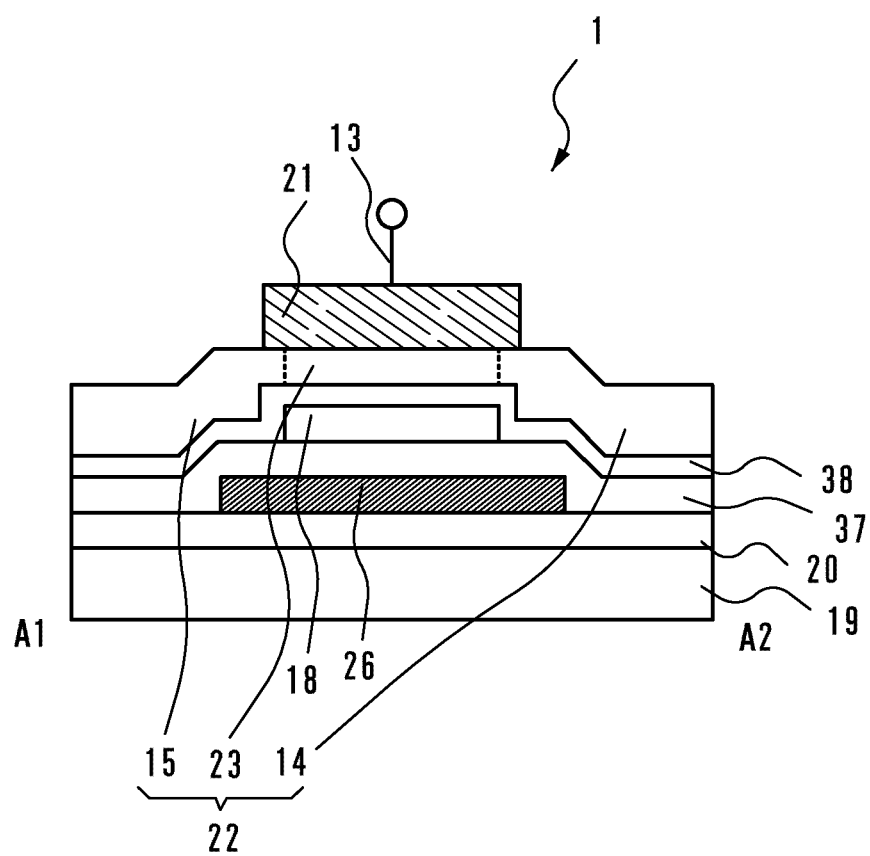
FIG. 15 is a cross-sectional view of a semiconductor device in Embodiment 4.

A cross-sectional view taken along a line A1-A2 in FIG. 14 is shown in FIG. 15. As shown in FIG. 15, a memory TFT 1 is connected to an adjacent selection TFT 31 through a drain 15 (see FIG. 14). The memory TFT 1 is connected to an adjacent memory TFT 2 through a source 14 (see FIG. 14). The operation of the NAND flash memory is similar to that in Embodiment 3, so that description thereof is omitted. The other structures are similar to those in FIG. 13; thus, description thereof is omitted.

As described above, according to this embodiment, the number of manufacturing steps of an erasing wiring can be decreased in addition to the effect which can be obtained in Embodiments 1 to 3.

(Embodiment 5)

In this embodiment, a method for manufacturing a semiconductor device having a top-gate structure is described with reference to FIGS. 16A to 16E. The semiconductor device in this embodiment has a different structure from those described in Embodiments 1 to 3. Here, a method for manufacturing the NAND flash memory shown in FIG. 9 is described.

Figure 16A:
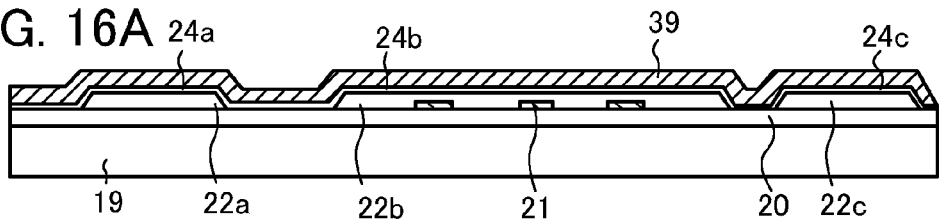
FIGS. 16A to 16E are cross-sectional views showing a manufacturing method of a semiconductor device in Embodiment 5.

First, as shown in FIG. 16A, a base insulating film 20 is formed over an insulating substrate 19. A metal film such as a tungsten film is formed over the entire surface of the base insulating film 20. Next, a metal wiring 21 is formed by patterning the metal film by lithography and etching as shown in FIG. 16A. The metal wiring 21 functions as an erasing wiring in a memory TFT which is finally completed.

As the insulating substrate 19, a glass substrate, a quartz substrate, or the like is preferably used. As the base insulating film 20, a silicon oxide film, a silicon nitride film, a silicon oxynitride film ($SiO_xN_y$) (x>y>0), or a silicon nitride oxide film ($SiN_xO_y$) (x>y>0) may be formed with a CVD method, a sputtering method, or the like.

In the case where the base insulating film 20 has a two-layer structure, a silicon nitride oxide film may be formed as a first insulating film and a silicon oxynitride film may be formed as a second insulating film. Alternatively, as the first insulating film, a silicon nitride film may be formed, and a silicon oxide film may be formed as the second insulating film. Formation of the base insulating film 20 in this manner can prevent an alkali metal such as Na or an alkaline earth metal from being diffused into an element provided thereover. Note that in the case where quartz is used for the insulating substrate 19, the base insulating film 20 is not necessarily formed.

The metal film may have a single-layer structure or a stacked-layer structure. As a material of the metal film, a metal selected from tantalum (Ta), titanium (Ti), molybdenum (Mo), aluminum (Al), copper (Cu), chromium (Cr), niobium (Nb), and the like is used in addition to tungsten (W). The metal film may be formed using an alloy or a compound containing the above metal as its main component as a material.

Next, island-shaped oxide semiconductor layers 22a, 22b, and 22c are formed over the metal wiring 21 and the base insulating film 20. The oxide semiconductor layer 22b is formed so as to cover a top surface and side surfaces of the metal wiring 21.

A method for forming the oxide semiconductor layers 22a, 22b, and 22c are described below in detail. As examples of an oxide semiconductor used for the oxide semiconductor layers, the following can be given: In—Ga—Zn—O-based oxide semiconductor; In—Sn—Zn—O-based oxide semiconductor; In—Al—Zn—O-based oxide semiconductor; Sn—Ga—Zn—O-based oxide semiconductor; Al—Ga—Zn—O-based oxide semiconductor; Sn—Al—Zn—O-based oxide semiconductor; In—Zn—O-based oxide semiconductor; Sn—Zn—O-based oxide semiconductor; Al—Zn—O-based oxide semiconductor; In—O-based oxide semiconductor; Sn—O-based oxide semiconductor; and Zn—O-based oxide semiconductor.

In this embodiment, the oxide semiconductor layers are formed with a sputtering method with the use of an In—Ga—Zn—O-based oxide semiconductor target.

For example, as a target for forming the oxide semiconductor layers with the sputtering method, a target with a relative proportion of $In_2O_3$:$Ga_2O_3$:ZnO=1:1:1 [mol %] (that is, In:Ga:Zn=1:1:0.5 [atom %]) can be used. Alternatively, a target with a relative proportion of In:Ga:Zn=1:1:1 [atom %] or In:Ga:Zn=1:1:2 [atom %] may be used. The fill rate of the oxide semiconductor target is 90% to 100%, preferably 95% or more (for example, 99.9%). By using an oxide semiconductor target with a high fill rate, a dense oxide semiconductor layer can be formed. Additionally, moisture absorbed onto the oxide semiconductor target can be decreased.

The atmosphere in which the oxide semiconductor layers are formed is preferably a rare gas (typically, argon) atmosphere, an oxygen atmosphere, or a mixed atmosphere of a rare gas (typically, argon) and oxygen. Specifically, it is preferable to use, for example, a high purity gas from which an impurity such as hydrogen, water, a hydroxyl group, or hydride is removed to a concentration of 1 ppm or less (preferably, 10 ppb or less).

In forming the oxide semiconductor layers, the substrate is held in a treatment chamber that is maintained at reduced pressure and the substrate temperature is set to 100° C. to 600° C., preferably 200° C. to 400° C. Thus, the concentration of an impurity contained in the oxide semiconductor layers can be decreased and damage by sputtering is reduced.

In addition, a sputtering gas from which hydrogen and water are removed is introduced into the treatment chamber while moisture remaining in the treatment chamber is being removed, and thus the oxide semiconductor layer is formed using the above target. To remove moisture remaining in the sputtering treatment chamber, an entrapment vacuum pump is preferably used. For example, a cryopump, an ion pump, or a titanium sublimation pump can be used. An evacuation unit may be a turbo pump provided with a cold trap. In a deposition chamber which is evacuated with the cryopump, a hydrogen atom, a compound containing a hydrogen atom such as water ($H_2O$) (more preferably, also a compound containing a carbon atom), and the like are evacuated, whereby the concentration of an impurity in the oxide semiconductor layer can be reduced.

The oxide semiconductor layers can be formed under the following conditions, for example: the distance between the insulating substrate and the target is 100 mm; the pressure is 0.6 Pa; the direct-current (DC) power is 0.5 kW; and the atmosphere is oxygen (the proportion of the oxygen flow is 100%). The thickness of the formed oxide semiconductor layers is 50 nm to 200 nm, preferably 5 nm to 30 nm Note that a pulsed direct-current (DC) power source is used because powder substances and the like generated during the film formation can be reduced and variations of the film thickness is reduced, which is preferable.

Note that before the oxide semiconductor layers are formed with the sputtering method, reverse sputtering may be performed in which plasma is generated with an argon gas introduced, so that surfaces of the base insulating film 20 and the metal wiring 21 are cleaned. Here, the reverse sputtering is a method for improving the quality of a surface of the object to be processed by ions colliding on the surface. As a method for colliding ions on a surface to be processed, a method in which high-frequency voltage is applied to the surface in an argon atmosphere so that plasma is generated near a substrate or the like is given. Note that an atmosphere of nitrogen, helium, oxygen, or the like may be used instead of an argon atmosphere.

After the oxide semiconductor layers are formed as described above, patterning is performed by lithography and etching. Thus, as shown in FIG. 16A, the oxide semiconductor layers 22a, 22b, and 22c are formed. After that, appropriate heat treatment is performed so that the electron carrier concentration of the oxide semiconductor layers 22a, 22b, and 22c are less than $1 \times 10^{16}$ $cm^{-3}$, preferably less than $1 \times 10^{12}$ $cm^{-3}$.

Next, first insulating films (tunnel insulating films) 24a, 24b, and 24c are formed so as to cover top surfaces and side surfaces of the oxide semiconductor layers 22a, 22b, and 22c. The first insulating film 24b functions as a tunnel insulating film of the memory TFT which is finally formed.

Here, the first insulating films 24a, 24b, and 24c are formed with a plasma CVD method or a sputtering method. At this time, when high-density plasma is used, an insulating film with high quality can be obtained, which is preferable.

The first insulating films 24a, 24b, and 24c can be formed to have a single-layer structure or a stacked-layer structure of any of a silicon oxide film, a silicon nitride film, a silicon oxynitride film, and a silicon nitride oxide film. For example, an insulating film including a silicon oxynitride film can be formed using silane and nitrogen monoxide as a film formation gas.

The film formation atmosphere may be an oxygen atmosphere, a rare gas atmosphere, a nitrogen atmosphere, or a mixed atmosphere of oxygen, a rare gas, and nitrogen. As a rare gas, Ar can be used, for example. Alternatively, a gas in which Ar and Kr are mixed may be used. Note that in the case where the first insulating films 24a, 24b, and 24c are formed using high-density plasma under a rare gas atmosphere, in some cases, the first insulating films 24a, 24b, and 24c contain a rare gas (including at least one of He, Ne, Ar, Kr, and Xe) used in plasma treatment.

Subsequently, a conductive film 39 is formed over the base insulating film 20 and the first insulating films 24a, 24b, and 24c. The conductive film 39 functions as a floating gate of the memory TFT which is finally completed. Here, the conductive film 39 is formed using a stacked film in which an upper layer film of a metal or an alloy thereof, metal oxide, metal nitride, or the like is stacked over a lower layer film.

As the lower layer film, for example, a film containing germanium as its main component is formed to have a thickness of 1 nm to 20 nm, preferably 1 nm to 10 nm. This film can be formed with a plasma CVD method under an atmosphere containing germanium (for example, $GeH_4$). In addition, a germanium film may be formed in such a manner that a germanium ($GeH_4$) gas attenuated by 5% to 10% with hydrogen is used, a heating temperature of the insulating substrate 19 is at 200° C. to 350° C., and high frequency power of 13.56 MHz to 60 MHz (for example, 27 MHz) is applied.

As the upper layer film, for example, a tantalum film is formed to have a thickness of 1 nm to 20 nm, preferably 1 nm to 10 nm Besides, a high melting point metal such as tungsten (W), titanium (Ti), molybdenum (Mo), chromium (Cr), or nickel (Ni) can be used. Further, niobium, zirconium, cerium, yttrium, or hafnium may be used for the high melting point metal to form an alloy.

Alternatively, metal oxide or metal nitride of the high melting point metal may be used for the upper layer film. As the metal oxide, tantalum oxide, titanium oxide, molybdenum oxide, or the like can be used. These metal oxides can be formed with a sputtering method, an electron beam evaporation method, or the like. As the metal nitride, tantalum nitride, tungsten nitride, molybdenum nitride, titanium nitride, or the like can be used. These metal nitrides can be formed with a sputtering method using a target of the above described metal nitride.

By forming the upper layer film of the floating gate using a metal or the like, the floating gate can be stabilized.

Figure 16B:
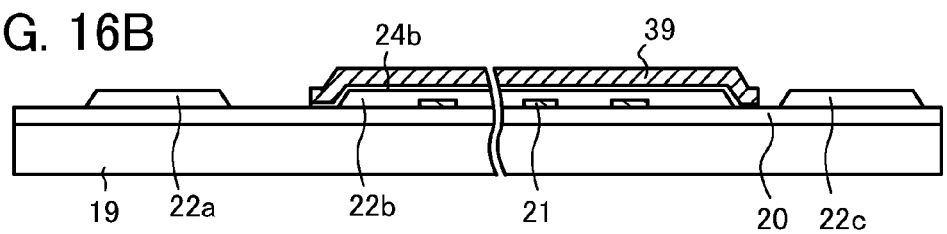
Figure 16C:
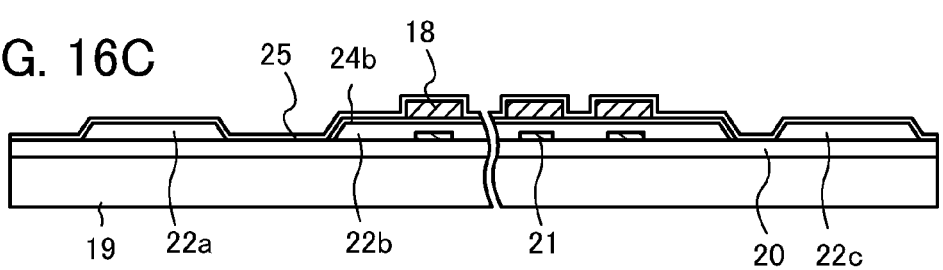

Next, the conductive film 39 is selectively etched and the first insulating films 24a and 24c are removed. In such a manner, the first insulating film 24b and the conductive film 39 remain over the oxide semiconductor layer 22b as shown in FIG. 16B. New resist mask is formed and the conductive film 39 is selectively etched, so that the floating gate 18 is formed as shown in FIG. 16C. Here, it should be noted that in this embodiment, the width of the floating gate 18 needs to be larger than that of the metal wiring 21. This is because a formation method for a source and a drain is different from those in other embodiments. Details will be described later.

Subsequently, a second insulating film 25 is formed so as to cover the oxide semiconductor layers 22a and 22c, the first insulating film 24b, and the floating gate 18. For example, any of a silicon oxide film, a silicon nitride film, a silicon oxynitride film ($SiO_xN_y$) (x>y>0), a silicon nitride oxide film ($SiN_xO_y$) (x>y>0), a germanium oxide film, or a germanium nitride film having a thickness of 5 nm to 50 nm is formed with a CVD method, a sputtering method, or the like. The second insulating film 25 may have a stacked-layer structure in which a plurality of the above films is stacked.

Note that the second insulating film 25 formed over the oxide semiconductor layer 22b functions as a gate insulating film in the memory TFT which is finally completed. The second insulating film 25 formed over the oxide semiconductor layers 22a and 22c functions as a gate insulating film of a selection transistor which is finally completed.

Next, a conductive film is formed over the entire surface of the second insulating film 25. This conductive film finally functions as a control gate of the memory TFT and a gate of the selection transistor. For example, a metal film using any of tantalum (Ta), tungsten (W), titanium (Ti), molybdenum (Mo), aluminum (Al), copper (Cu), chromium (Cr), or niobium (Nb), and the like or an alloy film containing any of the above metals as its main component is formed. In addition, the conductive film may be a metal nitride film obtained by nitriding of the above metal film or the above alloy film or a semiconductor film obtained by doping impurities such as phosphorus. The conductive film may be a single-layer film of the above film or a stacked film including a plurality of the above films.

Here, the conductive film has a stacked-layer structure in which tantalum nitride is formed as a lower layer film and tungsten is formed thereover. Further, a tungsten nitride film, a molybdenum nitride film, a titanium nitride film, or the like can be used as the lower layer film. As an upper layer film, a tantalum film, a molybdenum film, a titanium film, or the like can be used.

Next, the conductive film is selectively etched to form a control gate 26 over the second insulating film 25 above the oxide semiconductor layer 22b and the floating gate 18. That is, the control gate 26 overlaps with the floating gate 18 through the second insulating film 25. At the same time, a gate 26a is formed above the oxide semiconductor layer 22a through the second insulating film 25, and a gate 26c is formed above the oxide semiconductor layer 22c through the second insulating film 25.

Moreover, ions are introduced into the oxide semiconductor layers 22a, 22b, and 22c using the control gate 26, the gates 26a and 26c, and the floating gate 18 as masks. As ions introduced here, hydrogen ions; ions which is a transition metal such as titanium, zinc, and gallium and is easily oxidized; or ions of phosphorus or arsenic is used.

In the case where hydrogen ions are introduced, the hydrogen ions become donors in the oxide semiconductor without any change and supply electrons to the oxide semiconductor layer, whereby an oxide semiconductor in a portion into which the hydrogen ions are introduced becomes n-type. In the case where ions of a transition metal, arsenic ions, or phosphorus ions are introduced, these ions take oxygen away from the oxide semiconductor, so that oxygen vacancy is caused in the oxide semiconductor. Electrons are supplied to the oxide semiconductor due to oxygen vacancy, whereby an oxide semiconductor in a portion into which ions are introduced becomes n-type.

The electron carrier concentration of an oxide semiconductor can be controlled by the amount of ions introduced. The carrier concentration in the portion of the oxide semiconductor into which ions are introduced is set to $1 \times 10^{19}$ cm$^{-3}$ or more, preferably $1 \times 10^{20}$ cm$^{-3}$ or more.

Figure 16D:
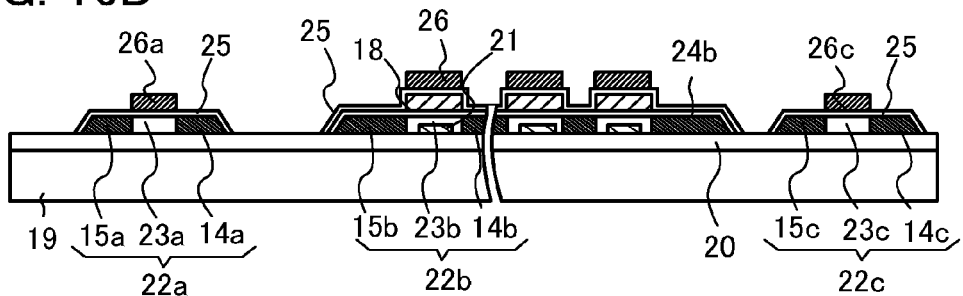

In such a manner, as shown in FIG. 16D, sources 14a, 14b, and 14c and drains 15a, 15b, and 15c are formed in the oxide semiconductor layers 22a, 22b, and 22c respectively. Channel formation regions 23a, 23b, and 23c are defined at the same time. At this time, the metal wiring 21 needs to be formed apart from at least one of the source 14b and the drain 15b, preferably both of them. This is because when the metal wiring 21 is in contact with both the source 14b and the drain 15b, electrical continuity between the source 14b and the drain 15b are always established, so that characteristics of a transistor cannot be obtained.

Note that when forming a source and a drain by introducing ions into a silicon semiconductor, it is necessary to perform annealing to recover the crystallinity of the semiconductor later so that conductivity of the source and the drain is increased. However, in an oxide semiconductor, enough conductivity can be obtained by performing ion implantation treatment even when annealing is not performed. This is because an oxide semiconductor has a special property of showing enough conductivity even in an amorphous state.

Figure 16E:
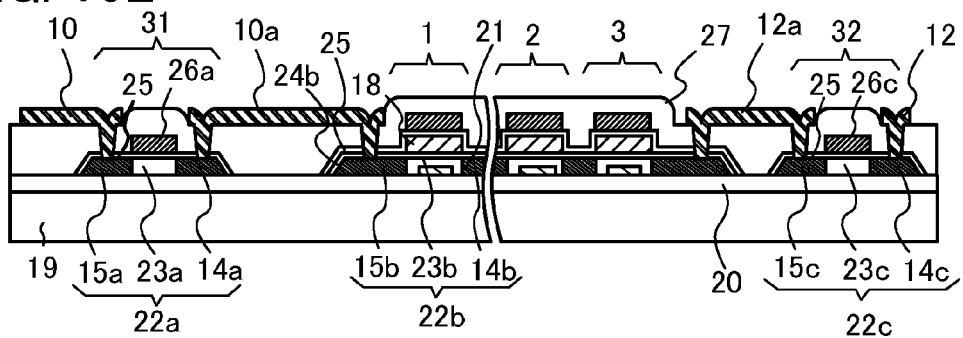

Next, an interlayer insulating film 27 is formed over the control gate 26 and the gates 26a and 26c. Contact holes penetrating through the interlayer insulating film 27 to reach the sources and the drains of the oxide semiconductor layers 22a, 22b, and 22c are formed. A metal film is formed to fill the contact holes. A bit line 10, a wiring 10a, a source line 12, and a wiring 12a are formed by lithography and etching as shown in FIG. 16E. Through the above described process, a NAND flash memory having a top-gate structure can be formed as shown in FIG. 16E.

With the above described manufacturing method, deterioration of the memory TFT can be suppressed and the number of rewriting operations can be increased in addition to obtained effects of shortening erasing operation of a semiconductor device and reducing power consumption. Further, reliability of the semiconductor device can be improved.

(Embodiment 6)

In this embodiment, a method for manufacturing a semiconductor device having a bottom-gate structure will be described with reference to FIGS. 17A to 17D. Here, a method for manufacturing the NAND flash memory shown in FIG. 9 is described. Note that detailed description of the same portions and functions as Embodiment 5 is omitted.

Figure 17A:
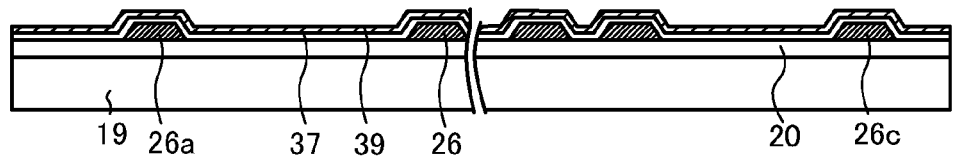
FIGS. 17A to 17D are cross-sectional views showing a manufacturing method of a semiconductor device in Embodiment 6.
Figure 17B:
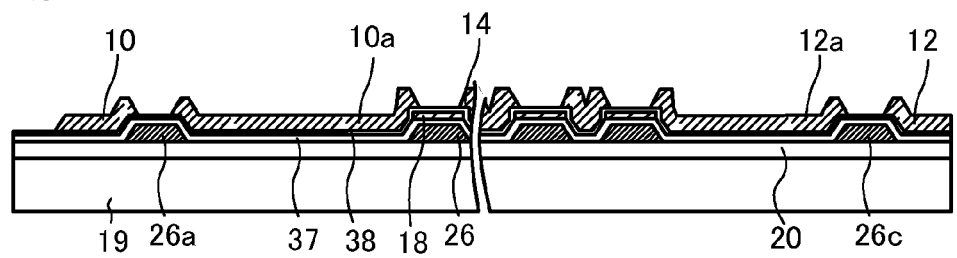

First, as shown in FIG. 17A, a base insulating film 20 is formed over an insulating substrate 19. Next, a conductive film is formed over the base insulating film 20. In this embodiment, a tungsten film having a thickness of 200 nm is formed with a CVD method. The conductive film is selectively etched so that a control gate 26, gates 26a and 26c are formed. The gate 26 functions as a control gate of a memory TFT which is finally completed. The gates 26a and 26c function as gates of selection TFTs which are finally completed.

Next, a first insulating film 37 is formed over the control gate 26 and the gates 26a and 26c. The first insulating film 37 functions as a gate insulating film in the memory TFT and the selection TFT which are finally completed. In this embodiment, a silicon oxide film having a thickness of 100 nm formed with a sputtering method is used.

Next, as shown in FIG. 17A, a conductive film 39 is formed over the first insulating film 37. In this embodiment, a tantalum film having a thickness of 100 nm is formed with a sputtering method.

Subsequently, the conductive film 39 is selectively etched to form a floating gate 18 over the first insulating film 37. At this time, the floating gate 18 is formed in a position overlapping with the control gate 26. Then, a second insulating film 38 is formed over the floating gate 18 and the first insulating film 37. The second insulating film 38 functions as a tunnel insulating film in the memory TFT which is finally completed. In this embodiment, a silicon oxide film having a thickness of 20 nm formed with a sputtering method is used.

Next, a layer formed of a metal is provided over the entire surface. In this embodiment, a titanium film having a thickness of 100 nm is formed with a sputtering method. The titanium film is selectively etched so that a bit line 10, a wiring 10a connecting a source of a selection TFT and a drain of an adjacent memory TFT, a source line 12, and a wiring 12a connecting a drain of a selection TFT and a source of an adjacent memory TFT are formed as shown in FIG. 17C.

Figure 17C:
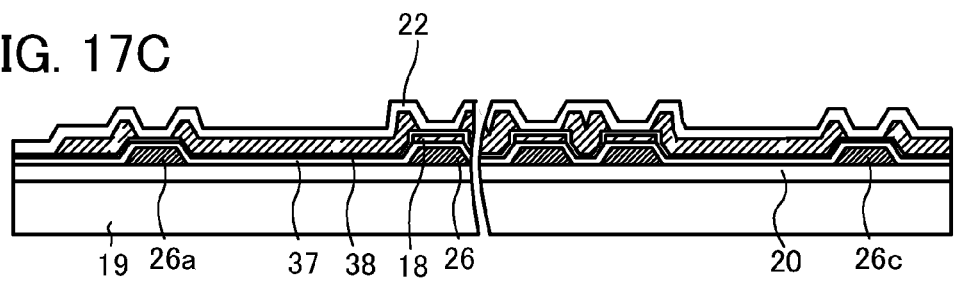

Next, as shown in FIG. 17C, an oxide semiconductor layer 22 is formed over the entire surface. In this embodiment, an oxide target having a proportion of In:Ga:Zn=1:1:1 is formed to have a thickness of 30 nm with a sputtering method. The film formation conditions and the like shown in other embodiments may be used. In this embodiment, both the electron carrier concentration and the hole carrier concentration in the oxide semiconductor layer 22 are less than $1 \times 10^{12}$ cm$^{-3}$.

Figure 17D:
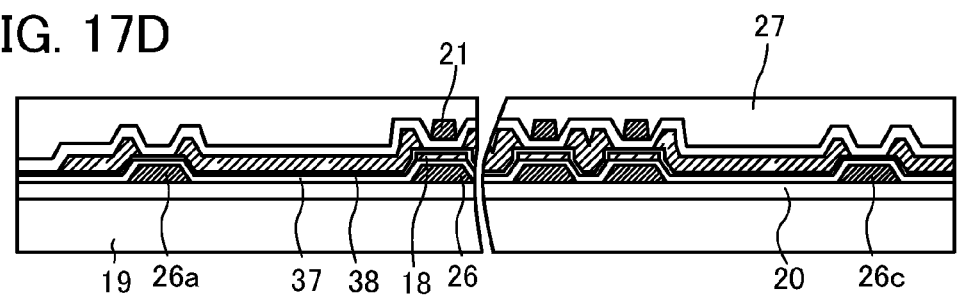

Next, a metal film is entirely formed in contact with the upper surface of the oxide semiconductor layer 22. In this embodiment, platinum whose work function is larger than electron affinity of the oxide semiconductor layer 22 is formed to have a thickness of 200 nm with a sputtering method. The metal layer is selectively etched to form a metal wiring 21 as shown in FIG. 17D. The metal wiring 21 functions as an erasing wiring in the memory TFT. In addition, an interlayer insulating film 27 is formed in order to protect a circuit. A wiring in an upper layer may further formed if needed. Through the above described process, a NAND flash memory having a bottom-gate structure can be formed.

In this embodiment, the oxide semiconductor layer 22 is not formed to be an island-shaped oxide semiconductor layer as shown in Embodiment 5; however, both the electron carrier concentration and the hole carrier concentration of the oxide semiconductor layer 22 are less than $1 \times 10^{12}$ cm$^{-3}$, so that dark resistance thereof is extremely high. In general, a semiconductor device is used so that a circuit is not exposed to light; therefore, separation between elements can be obtained even when the oxide semiconductor layer 22 is not physically separated.

(Embodiment 7)

In this embodiment, examples of an electronic appliance mounted with a semiconductor integrated device which can be obtained in any of Embodiments 1 to 6 are described with reference to FIGS. 18A to 18E. The above semiconductor device can store data even in the case where supply of power is stopped. Further, deterioration due to writing and erasing can be suppressed. Furthermore, operation speed thereof is high. For these reasons, an electronic appliance with a new structure can be provided by using the semiconductor device. Note that the above semiconductor device is integrated and mounted on a circuit substrate and the like and placed inside each electric appliance.

Figure 18A:
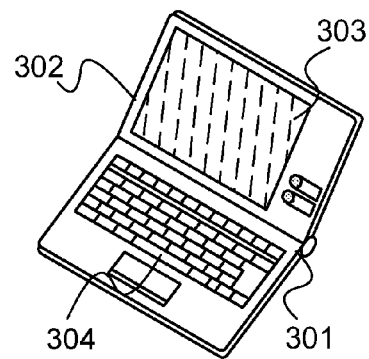
FIGS. 18A to 18F are diagrams of electronic appliances including semiconductor devices in any of Embodiments 1 to 6.

FIG. 18A shows a laptop personal computer including the semiconductor device obtained in any of Embodiments 1 to 6. The laptop personal computer includes a main body 301, a housing 302, a display portion 303, a keyboard 304, and the like. The semiconductor device according to one embodiment of the present invention is applied to a laptop personal computer, whereby the laptop personal computer can store data even when power is not supplied. Further, deterioration due to writing and erasing is suppressed. Furthermore, operation speed thereof is high. For these reasons, it is preferable to apply the semiconductor device according to one embodiment of the present invention to a laptop personal computer.

Figure 18D:
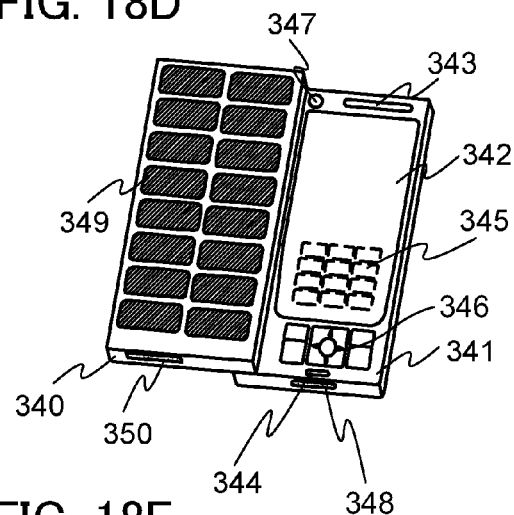
Figure 18B:
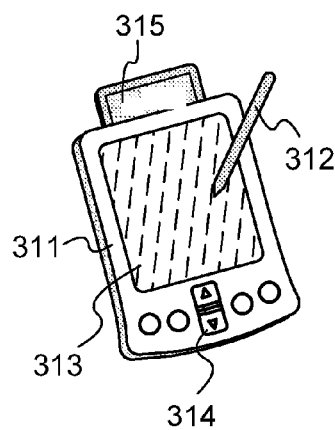

FIG. 18B shows a personal digital assistant (PDA) including the semiconductor device obtained in any of Embodiments 1 to 6. The personal digital assistant includes a main body 311 provided with a display portion 313, an external interface 315, operational keys 314, and the like. A stylus 312 that is an accessory for operating the PDA is provided. The semiconductor device according to an embodiment of the present invention is applied to the PDA, whereby the PDA can store data even in the case where supply of power is stopped. Further, deterioration due to writing and erasing can be suppressed. Furthermore, operation speed thereof is high. For these reasons, it is preferable to apply the semiconductor device according to an embodiment of the present invention to a PDA.

Figure 18E:
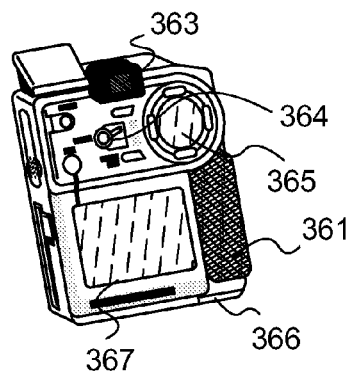
Figure 18C:
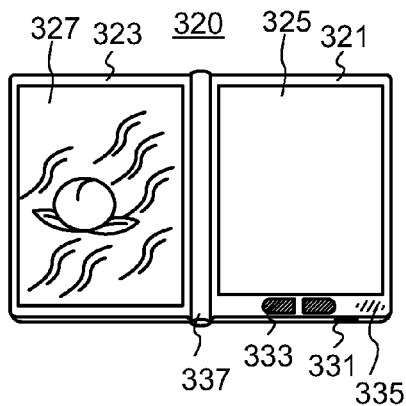

FIG. 18C shows an e-book reader 320 as an example of electronic paper including the semiconductor device obtained in any of Embodiments 1 to 6. The e-book reader 320 includes two housings: a housing 321 and a housing 323. The housing 321 and the housing 323 are combined with a hinge 337 so that the e-book reader 320 can be opened and closed with the hinge 337 as an axis. With such a structure, the e-book reader 320 can be used like a paper book. The semiconductor device according to an embodiment of the present invention is applied to electronic paper, whereby the electronic paper can store data even when power is not supplied. Further, deterioration due to writing and erasing can be suppressed. Furthermore, operation speed thereof is high. For these reasons, it is preferable to apply the semiconductor device according to an embodiment of the present invention to electronic paper.

A display portion 325 is incorporated in the housing 321 and a display portion 327 is incorporated in the housing 323. The display portion 325 and the display portion 327 may display one image or different images. When the display portion 325 and the display portion 327 display different images, for example, the right display portion (the display portion 325 in FIG. 18C) can display text and the left display portion (the display portion 327 in FIG. 18C) can display images.

In addition, the housing 321 includes a power button 331, control keys 333, a speaker 335, and the like. Pages can be turned with the operation keys 333. Note that a keyboard, a pointing device, or the like may also be provided on the surface of the housing, on which the display portion is provided. An external connection terminal (an earphone terminal, a USB terminal, a terminal that can be connected to various cables such as an AC adapter and a USB cable, or the like), a recording medium insertion portion, and the like may be provided on the back surface or the side surface of the housing. The e-book reader 320 may have a function of an electronic dictionary.

The e-book reader 320 may send and receive data wirelessly. Through wireless communication, desired book data or the like can be purchased and downloaded from an electronic book server.

Note that electronic paper can be applied to devices in a variety of fields as long as they display data. For example, electronic paper can be used for posters, advertisement in vehicles such as trains, display in a variety of cards such as credit cards, and the like in addition to e-book readers.

FIG. 18D shows an example of a mobile phone including the semiconductor device obtained in any of Embodiments 1 to 6. The mobile phone includes two housings: a housing 340 and a housing 341. The housing 341 is provided with a display panel 342, a speaker 343, a microphone 344, a pointing device 346, a camera lens 347, an external connection terminal 348, and the like. The housing 341 includes a solar cell 349 for charging the mobile phone, an external memory slot 350, and the like. An antenna is built in the housing 341. The semiconductor device according to an embodiment of the present invention is applied to a mobile phone, whereby the mobile phone can store data even when power is not supplied. Further, deterioration due to writing and erasing can be suppressed. Furthermore, operation speed thereof is high. For these reasons, it is preferable to apply the semiconductor device according to an embodiment of the present invention to a mobile phone.

The display panel 342 has a touch panel function. A plurality of control keys 345 which is displayed as an image are shown by dashed lines in FIG. 18D. Note that the mobile phone includes a booster circuit for boosting a voltage output from the solar cell 349 to a voltage necessary for each circuit. The mobile phone can include a contactless IC chip, a small recording device, or the like in addition to the above structure.

The direction of display on the display panel 342 is changed as appropriate depending on applications. The camera lens 347 is provided on the same surface as the display panel 342, so that videophone calls are possible. The speaker 343 and the microphone 344 can be used for videophone calls, recording and playing sound, and the like as well as voice calls. Moreover, the housings 340 and 341 which are shown unfolded in FIG. 18D can overlap with each other by sliding. Thus, the mobile phone can be in a suitable size for portable use.

The external connection terminal 348 can be connected to a variety of cables such as an AC adapter or a USB cable, so that the mobile phone can be charged or can perform data communication. The mobile phone can store and move a larger amount of data by inserting a recording medium into the external memory slot 350. In addition to the above functions, an infrared communication function, a television reception function, or the like may be provided.

FIG. 18E shows an example of a digital camera including the semiconductor device obtained in any of Embodiments 1 to 6. The digital camera includes a main body 361, a display portion (A) 367, an eyepiece portion 363, an operation switch 364, a display portion (B) 365, a battery 366, and the like. The semiconductor device according to an embodiment of the present invention is applied to a digital camera, whereby the digital camera can store data even when power is not supplied. Further, deterioration due to writing and erasing can be suppressed. Furthermore, operation speed thereof is high. For these reasons, it is preferable to apply the semiconductor device according to an embodiment of the present invention to a digital camera.

Figure 18F:
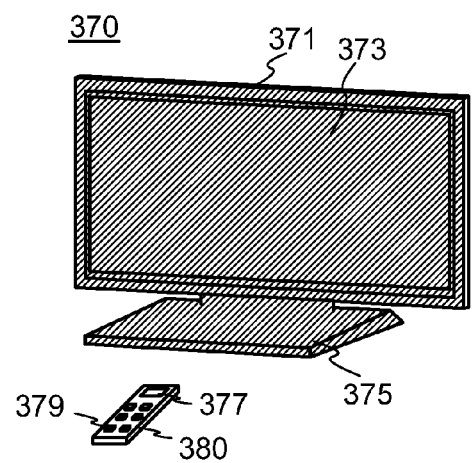

FIG. 18F shows an example of a television set including the semiconductor device obtained in any of Embodiments 1 to 6. In a television set 370, a display portion 373 is incorporated in a housing 371. Images can be displayed on the display portion 373. Note that here, the housing 371 is supported by a stand 375.

The television set 370 can be operated by an operation switch of the housing 371 or a separate remote controller 380. With operation keys 379 of the remote controller 380, channels and volume can be controlled and images displayed on the display portion 373 can be operated. The remote controller 380 may include a display portion 377 for displaying data output from the remote controller 380. The semiconductor device according to an embodiment of the present invention is applied to a television set, whereby the television set can store data even when power is not supplied. Further, deterioration due to writing and erasing can be suppressed. Furthermore, operation speed thereof is high. For these reasons, it is preferable to apply the semiconductor device according to an embodiment of the present invention to a television set.

Note that the television set 370 is preferably provided with a receiver, a modem, and the like. A general television broadcast can be received with the receiver. When the television set is connected to a communication network with or without wires through the modem, one-way (from a sender to a receiver) or two-way (between a sender and a receiver or between receivers) data communication can be performed.

The structures, methods, and the like shown in this embodiment can be combined with any of the structures and the methods of the other embodiments as appropriate.

This application is based on Japanese Patent Application serial no. 2009-295335 filed with Japan Patent Office on Dec. 25, 2009, the entire contents of which are hereby incorporated by reference.

What is claimed is:

1. A semiconductor device comprising:
   a metal wiring;
   an oxide semiconductor layer provided over and in contact with the metal wiring;
   a first insulating film provided over the oxide semiconductor layer;
   a floating gate provided over the first insulating film;
   a second insulating film provided over the floating gate; and
   a control gate provided over the second insulating film.

2. The semiconductor device according to claim 1, wherein an electron carrier concentration of the oxide semiconductor layer is less than $1 \times 10^{16}$ cm$^{-3}$.

3. The semiconductor device according to claim 1, wherein the oxide semiconductor layer contains In and Zn.

4. The semiconductor device according to claim 1, wherein the metal wiring contains Al or Cu.

5. The semiconductor device according to claim 1, wherein a width of the metal wiring is larger than or equal to a width of the floating gate.

6. The semiconductor device according to claim 1, wherein the metal wiring is provided so as to overlap with the floating gate, and both edges of the metal wiring are aligned with or on an outer side than both edges of the floating gate.

7. The semiconductor device according to claim 1, wherein a width of the metal wiring is smaller than a width of the floating gate.

8. The semiconductor device according to claim 1, wherein the metal wiring is provided so as to overlap with the floating gate, and both edges of the metal wiring are on an inner side than the both edges of the floating gate.

9. A semiconductor device comprising:
   a control gate;
   a first insulating film provided over the control gate;
   a floating gate provided over the first insulating film;
   a second insulating film provided over the floating gate;
   an oxide semiconductor layer provided over the second insulating film; and
   a metal wiring provided over and in contact with the oxide semiconductor layer.

10. The semiconductor device according to claim 9, wherein an electron carrier concentration of the oxide semiconductor layer is less than $1 \times 10^{16}$ cm$^{-3}$.

11. The semiconductor device according to claim 9, wherein the oxide semiconductor layer contains In and Zn.

12. The semiconductor device according to claim 9, wherein the metal wiring contains Al or Cu.

13. The semiconductor device according to claim 9, wherein a width of the metal wiring is larger than or equal to a width of the floating gate.

14. The semiconductor device according to claim 9, wherein the metal wiring is provided so as to overlap with the floating gate, and both edges of the metal wiring are aligned with or on an outer side than both edges of the floating gate.

15. The semiconductor device according to claim 9, wherein a width of the metal wiring is smaller than a width of the floating gate.

16. The semiconductor device according to claim 9, wherein the metal wiring is provided so as to overlap with the floating gate, and both edges of the metal wiring are on an inner side than the both edges of the floating gate.

17. A method for manufacturing a semiconductor device comprising the steps of:
   forming a metal wiring;
   forming an oxide semiconductor layer over the metal wiring;
   forming a first insulating film over the oxide semiconductor layer;
   forming a floating gate over the first insulating film;
   forming a second insulating film over the floating gate; and
   forming a control gate over the second insulating film.

18. The method for manufacturing a semiconductor device, according to claim 17, wherein an electron carrier concentration of the oxide semiconductor layer is less than $1 \times 10^{16}$ cm$^{-3}$.

19. The method for manufacturing a semiconductor device, according to claim 17, wherein the oxide semiconductor layer contains In and Ga.

20. The method for manufacturing a semiconductor device, according to claim 17, wherein the metal wiring contains Al or Cu.

21. The method for manufacturing a semiconductor device, according to claim 17, wherein a width of the metal wiring is larger than or equal to a width of the floating gate.

22. The method for manufacturing a semiconductor device, according to claim 17, wherein the metal wiring is provided so as to overlap with the floating gate, and both edges of the metal wiring are aligned with or on an outer side than both edges of the floating gate.

23. The method for manufacturing a semiconductor device, according to claim 17, wherein a width of the metal wiring is smaller than a width of the floating gate.

24. The method for manufacturing a semiconductor device, according to claim 17, wherein the metal wiring is provided so as to overlap with the floating gate, and both edges of the metal wiring are on an inner side than both edges of the floating gate.

25. A method for manufacturing a semiconductor device comprising the steps of:
   forming a control gate;
   forming a first insulating film over the control gate;
   forming a floating gate over the first insulating film;
   forming a second insulating film over the floating gate;
   forming an oxide semiconductor layer over the second insulating film; and
   forming a metal wiring over the oxide semiconductor layer.

26. The method for manufacturing a semiconductor device, according to claim 25, wherein an electron carrier concentration of the oxide semiconductor layer is less than $1 \times 10^{16}$ cm$^{-3}$.

27. The method for manufacturing a semiconductor device, according to claim 25, wherein the oxide semiconductor layer contains In and Ga.

28. The method for manufacturing a semiconductor device, according to claim 25, wherein the metal wiring contains Al or Cu.

29. The method for manufacturing a semiconductor device, according to claim 25, wherein a width of the metal wiring is larger than or equal to a width of the floating gate.

30. The method for manufacturing a semiconductor device, according to claim 25, wherein the metal wiring is provided so as to overlap with the floating gate, and both edges of the metal wiring are aligned with or on an outer side than both edges of the floating gate.

31. The method for manufacturing a semiconductor device, according to claim 25, wherein a width of the metal wiring is smaller than a width of the floating gate.

32. The method for manufacturing a semiconductor device, according to claim 25, wherein the metal wiring is provided so as to overlap with the floating gate, and both edges of the metal wiring are on an inner side than both edges of the floating gate.

* * * * *